US007732305B2

(12) United States Patent
Ye et al.

(10) Patent No.: US 7,732,305 B2
(45) Date of Patent: *Jun. 8, 2010

(54) USE OF CL2 AND/OR HCL DURING SILICON EPITAXIAL FILM FORMATION

(75) Inventors: Zhiyuan Ye, Cupertino, CA (US); Yihwan Kim, Milpitas, CA (US); Xiaowei Li, Sunnyvale, CA (US); Ali Zojaji, Santa Clara, CA (US); Nicholas C. Dalida, Fremont, CA (US); Jinsong Tang, Santa Clara, CA (US); Xiao Chen, San Jose, CA (US); Arkadii V. Samoilov, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/494,903

(22) Filed: Jul. 28, 2006

(65) Prior Publication Data

US 2006/0260538 A1    Nov. 23, 2006

Related U.S. Application Data

(63) Continuation of application No. 11/227,974, filed on Sep. 14, 2005, which is a continuation-in-part of application No. 11/001,774, filed on Dec. 1, 2004, now Pat. No. 7,312,128.

(51) Int. Cl.
H01L 21/20 (2006.01)
(52) U.S. Cl. .................. 438/478; 438/488; 438/719; 438/753; 257/E23.116; 257/E23.128; 257/E21.502
(58) Field of Classification Search .................. 438/478, 438/482, 488, 719, 753, 637, 638; 257/E21.579, 257/E23.116, E23.128, E21.502
See application file for complete search history.

(56) References Cited

U.S. PATENT DOCUMENTS

| 3,675,619 A | 7/1972 | Burd |
| 4,429,324 A | 1/1984 | Wilkens |

(Continued)

FOREIGN PATENT DOCUMENTS

EP    1 150 345    10/2001

(Continued)

OTHER PUBLICATIONS

Argarwal, et al., "Challenges in Integrating the High-K Gate Dielectric Film to the Conventional CMOS Process Flow," Mat. Sec. Soc. Sump. Proc. vol. 670 (2001) pp. K2.1.1-K2.1.11.

(Continued)

*Primary Examiner*—Michelle Estrada
(74) *Attorney, Agent, or Firm*—Dugan & Dugan, PC

(57) ABSTRACT

In a first aspect, a method of forming an epitaxial film on a substrate is provided. The method includes (a) providing a substrate; (b) exposing the substrate to a silicon source and a carbon source so as to form a carbon-containing silicon epitaxial film; (c) encapsulating the carbon-containing silicon epitaxial film with an encapsulating film; and (d) exposing the substrate to Cl2 so as to etch the encapsulating film. Numerous other aspects are provided.

21 Claims, 9 Drawing Sheets

U.S. PATENT DOCUMENTS

| | | | |
|---|---|---|---|
| 4,834,831 A | 5/1989 | Nishizawa et al. |
| 5,112,439 A | 5/1992 | Reisman et al. |
| 5,236,545 A | 8/1993 | Pryor |
| 5,273,930 A | 12/1993 | Steele et al. |
| 5,288,658 A | 2/1994 | Ishihara |
| 5,294,286 A | 3/1994 | Nishizawa et al. |
| 5,360,760 A | 11/1994 | Hayashi |
| 5,372,860 A | 12/1994 | Fehlner et al. |
| 5,374,570 A | 12/1994 | Nasu et al. |
| 5,378,651 A | 1/1995 | Agnello et al. |
| 5,469,806 A | 11/1995 | Mochizuki et al. |
| 5,480,818 A | 1/1996 | Matsumoto et al. |
| 5,503,875 A | 4/1996 | Imai et al. |
| 5,521,126 A | 5/1996 | Okamura et al. |
| 5,527,733 A | 6/1996 | Nishizawa et al. |
| 5,674,304 A | 10/1997 | Fukada et al. |
| 5,693,139 A | 12/1997 | Nishizawa et al. |
| 5,796,116 A | 8/1998 | Nakata et al. |
| 5,807,792 A | 9/1998 | Ilg et al. |
| 5,849,092 A | 12/1998 | Xi et al. |
| 5,906,680 A | 5/1999 | Meyerson |
| 5,916,365 A | 6/1999 | Sherman |
| 6,019,839 A | 2/2000 | Achutharaman |
| 6,025,627 A | 2/2000 | Forbes et al. |
| 6,042,654 A | 3/2000 | Comita et al. |
| 6,055,927 A | 5/2000 | Shang et al. |
| 6,110,291 A | 8/2000 | Haruta et al. |
| 6,124,158 A | 9/2000 | Dautartas et al. |
| 6,144,060 A | 11/2000 | Park et al. |
| 6,159,852 A | 12/2000 | Nuttall et al. |
| 6,177,717 B1 * | 1/2001 | Chantre et al. ............... 257/565 |
| 6,200,893 B1 | 3/2001 | Sneh |
| 6,207,487 B1 | 3/2001 | Kim et al. |
| 6,228,728 B1 | 5/2001 | Furukawa et al. |
| 6,232,196 B1 | 5/2001 | Raaijmakers et al. |
| 6,270,572 B1 | 8/2001 | Kim et al. |
| 6,284,646 B1 | 9/2001 | Leem |
| 6,284,686 B1 | 9/2001 | Marlor |
| 6,287,965 B1 | 9/2001 | Kang et al. |
| 6,291,319 B1 | 9/2001 | Yu et al. |
| 6,305,314 B1 | 10/2001 | Sneh et al. |
| 6,335,280 B1 | 1/2002 | van der Jeugd |
| 6,342,277 B1 | 1/2002 | Sherman |
| 6,348,420 B1 | 2/2002 | Raaijmakers et al. |
| 6,352,945 B1 | 3/2002 | Matsuki et al. |
| 6,358,829 B2 | 3/2002 | Yoon et al. |
| 6,383,955 B1 | 5/2002 | Matsuki et al. |
| 6,391,785 B1 | 5/2002 | Satta et al. |
| 6,391,803 B1 | 5/2002 | Kim et al. |
| 6,399,491 B2 | 6/2002 | Jeon et al. |
| 6,410,463 B1 | 6/2002 | Matsuki |
| 6,451,119 B2 | 9/2002 | Sneh et al. |
| 6,458,718 B1 | 10/2002 | Todd |
| 6,462,367 B2 | 10/2002 | Marsh et al. |
| 6,468,924 B2 | 10/2002 | Lee et al. |
| 6,489,241 B1 | 12/2002 | Thilderkvist et al. |
| 6,492,283 B2 | 12/2002 | Raaijmakers et al. |
| 6,511,539 B1 | 1/2003 | Raaijmakers |
| 6,534,395 B2 | 3/2003 | Werkhoven et al. |
| 6,544,900 B2 | 4/2003 | Raaijmakers et al. |
| 6,559,520 B2 | 5/2003 | Matsuki et al. |
| 6,562,720 B2 | 5/2003 | Thilderkvist et al. |
| 6,576,535 B2 | 6/2003 | Drobny et al. |
| 6,590,344 B2 | 7/2003 | Tao et al. |
| 6,620,670 B2 | 9/2003 | Song et al. |
| 6,630,413 B2 | 10/2003 | Todd |
| 6,632,279 B1 | 10/2003 | Ritala et al. |
| 6,653,212 B1 | 11/2003 | Yamanaka et al. |
| 6,656,812 B1 * | 12/2003 | Marty et al. ............... 438/343 |
| 6,776,841 B2 | 8/2004 | Pyi |
| 6,797,558 B2 | 9/2004 | Nuttall et al. |
| 6,821,825 B2 | 11/2004 | Todd |
| 6,998,305 B2 | 2/2006 | Arena et al. |
| 7,045,840 B2 | 5/2006 | Tamai |
| 7,121,286 B2 | 10/2006 | Nakao |
| 7,230,274 B2 | 6/2007 | O'Loughlin et al. |
| 7,235,492 B2 | 6/2007 | Samoilov |
| 7,312,128 B2 | 12/2007 | Kim et al. |
| 7,353,841 B2 | 4/2008 | Kono et al. |
| 7,354,821 B2 * | 4/2008 | Chung et al. ............... 438/243 |
| 7,361,563 B2 | 4/2008 | Shin et al. |
| 7,438,760 B2 | 10/2008 | Bauer et al. |
| 7,588,980 B2 | 9/2009 | Kim et al. |
| 2001/0000866 A1 | 5/2001 | Sneh et al. |
| 2001/0020712 A1 | 9/2001 | Raaijmakers et al. |
| 2001/0024387 A1 | 9/2001 | Raaijmakers et al. |
| 2001/0024871 A1 | 9/2001 | Yagi |
| 2001/0028924 A1 | 10/2001 | Sherman |
| 2001/0034123 A1 | 10/2001 | Jeon et al. |
| 2001/0041250 A1 | 11/2001 | Werkhoven et al. |
| 2001/0046567 A1 | 11/2001 | Matsuki et al. |
| 2001/0055672 A1 | 12/2001 | Todd |
| 2002/0000598 A1 | 1/2002 | Kang et al. |
| 2002/0016084 A1 | 2/2002 | Todd |
| 2002/0022347 A1 | 2/2002 | Park et al. |
| 2002/0031618 A1 | 3/2002 | Sherman |
| 2002/0047151 A1 | 4/2002 | Kim et al. |
| 2002/0060363 A1 | 5/2002 | Xi et al. |
| 2002/0074588 A1 | 6/2002 | Lee |
| 2002/0076837 A1 | 6/2002 | Hujanen et al. |
| 2002/0090818 A1 | 7/2002 | Thilderkvist et al. |
| 2002/0093042 A1 | 7/2002 | Oh et al. |
| 2002/0098627 A1 | 7/2002 | Pomarede et al. |
| 2002/0117399 A1 | 8/2002 | Chen et al. |
| 2002/0145168 A1 | 10/2002 | Bojarczuk, Jr. et al. |
| 2002/0155722 A1 | 10/2002 | Satta et al. |
| 2002/0168868 A1 | 11/2002 | Todd |
| 2002/0172768 A1 | 11/2002 | Endo et al. |
| 2002/0173113 A1 | 11/2002 | Todd |
| 2002/0173130 A1 | 11/2002 | Pomerede et al. |
| 2002/0197831 A1 | 12/2002 | Todd et al. |
| 2002/0197881 A1 | 12/2002 | Ramdani et al. |
| 2003/0013320 A1 | 1/2003 | Kim et al. |
| 2003/0015764 A1 | 1/2003 | Raaijmakers et al. |
| 2003/0022528 A1 | 1/2003 | Todd |
| 2003/0032281 A1 | 2/2003 | Werkhoven et al. |
| 2003/0036268 A1 | 2/2003 | Brabant et al. |
| 2003/0049942 A1 | 3/2003 | Haukka et al. |
| 2003/0060057 A1 | 3/2003 | Raaijmakers et al. |
| 2003/0066486 A1 | 4/2003 | Zheng et al. |
| 2003/0072884 A1 | 4/2003 | Zhang et al. |
| 2003/0072975 A1 | 4/2003 | Shero et al. |
| 2003/0079677 A1 | 5/2003 | Pyi |
| 2003/0082300 A1 | 5/2003 | Todd et al. |
| 2003/0089308 A1 | 5/2003 | Raaijmakers |
| 2003/0089942 A1 | 5/2003 | Bhattacharyya |
| 2003/0101927 A1 | 6/2003 | Raaijmakers |
| 2003/0106490 A1 | 6/2003 | Jallepally et al. |
| 2003/0108674 A1 | 6/2003 | Chung et al. |
| 2003/0116804 A1 | 6/2003 | Visokay et al. |
| 2003/0124262 A1 | 7/2003 | Chen et al. |
| 2003/0129826 A1 | 7/2003 | Werkhoven et al. |
| 2003/0143841 A1 | 7/2003 | Yang et al. |
| 2003/0160277 A1 | 8/2003 | Bhattacharyya |
| 2003/0162370 A1 | 8/2003 | Sukegawa et al. |
| 2003/0166318 A1 | 9/2003 | Zheng et al. |
| 2003/0172872 A1 | 9/2003 | Thakur et al. |
| 2003/0173586 A1 | 9/2003 | Moriwaki et al. |
| 2003/0185980 A1 | 10/2003 | Endo |
| 2003/0186561 A1 | 10/2003 | Law et al. |
| 2003/0188682 A1 | 10/2003 | Tois et al. |
| 2003/0189208 A1 | 10/2003 | Law et al. |
| 2003/0189232 A1 | 10/2003 | Law et al. |
| 2003/0190423 A1 | 10/2003 | Yang et al. |

| | | |
|---|---|---|
| 2003/0190497 A1 | 10/2003 | Yang et al. |
| 2003/0194853 A1 | 10/2003 | Jeon |
| 2003/0198754 A1 | 10/2003 | Xi et al. |
| 2003/0207555 A1 | 11/2003 | Takayanagi et al. |
| 2003/0213560 A1 | 11/2003 | Wang et al. |
| 2003/0213977 A1 | 11/2003 | Toyoda et al. |
| 2003/0215570 A1 | 11/2003 | Seutter et al. |
| 2003/0216981 A1 | 11/2003 | Tillman |
| 2003/0224566 A1 | 12/2003 | Clampitt et al. |
| 2003/0232554 A1 | 12/2003 | Blum et al. |
| 2003/0235961 A1 | 12/2003 | Metzner et al. |
| 2004/0007747 A1 | 1/2004 | Visokay et al. |
| 2004/0009307 A1 | 1/2004 | Koh et al. |
| 2004/0009675 A1 | 1/2004 | Eissa et al. |
| 2004/0016973 A1 | 1/2004 | Rotondaro et al. |
| 2004/0023462 A1 | 2/2004 | Rotondaro et al. |
| 2004/0033674 A1 | 2/2004 | Todd |
| 2004/0033698 A1 | 2/2004 | Lee et al. |
| 2004/0043149 A1 | 3/2004 | Gordon et al. |
| 2004/0043569 A1 | 3/2004 | Ahn et al. |
| 2004/0053484 A1 | 3/2004 | Kumar et al. |
| 2004/0171238 A1 | 9/2004 | Arena et al. |
| 2004/0175950 A1 | 9/2004 | Puppo et al. |
| 2004/0182423 A1 | 9/2004 | Nakao |
| 2004/0226911 A1 | 11/2004 | Dutton et al. |
| 2004/0235229 A1 | 11/2004 | Hokazono |
| 2004/0253776 A1 | 12/2004 | Hoffmann et al. |
| 2005/0054171 A1 | 3/2005 | Chu et al. |
| 2005/0093154 A1* | 5/2005 | Kottantharayil et al. ..... 257/745 |
| 2005/0170604 A1 | 8/2005 | Orlowski et al. |
| 2005/0191866 A1 | 9/2005 | Powell |
| 2005/0241671 A1 | 11/2005 | Dong et al. |
| 2005/0263795 A1 | 12/2005 | Choi et al. |
| 2005/0266692 A1 | 12/2005 | Brask |
| 2005/0277272 A1* | 12/2005 | Singh et al. ................. 438/479 |
| 2006/0057821 A1 | 3/2006 | Lee et al. |
| 2006/0088978 A1 | 4/2006 | Clarke et al. |
| 2006/0115933 A1 | 6/2006 | Ye |
| 2006/0115934 A1 | 6/2006 | Kim et al. |
| 2006/0166414 A1 | 7/2006 | Carlson et al. |
| 2006/0234504 A1 | 10/2006 | Bauer et al. |
| 2007/0108450 A1* | 5/2007 | O'Loughlin et al. .......... 257/77 |
| 2007/0117414 A1 | 5/2007 | Moffatt |
| 2007/0259112 A1 | 11/2007 | Ishikawa |
| 2007/0286956 A1 | 12/2007 | Samoilov |
| 2008/0022924 A1 | 1/2008 | Kim |
| 2008/0026549 A1 | 1/2008 | Kim |
| 2008/0044932 A1 | 2/2008 | Samoilov |

FOREIGN PATENT DOCUMENTS

| | | |
|---|---|---|
| EP | 1 598 881 | 11/2005 |
| GB | 2 355 727 | 5/2001 |
| JP | 58-098917 | 6/1983 |
| JP | 60037121 | 2/1985 |
| JP | 62-171999 | 7/1987 |
| JP | 63-062313 | 3/1988 |
| JP | 63224218 | 9/1988 |
| JP | 01-143221 | 6/1989 |
| JP | 01189913 | 7/1989 |
| JP | 01-270593 | 10/1989 |
| JP | 02-172895 | 7/1990 |
| JP | 03-286522 | 12/1991 |
| JP | 05-047665 | 2/1993 |
| JP | 05-102189 | 4/1993 |
| JP | 05208897 | 8/1993 |
| JP | 05-251339 | 9/1993 |
| JP | 05347249 | 12/1993 |
| JP | 06-196809 | 7/1994 |
| JP | 300649 | 11/1995 |
| JP | 2001-111000 | 4/2001 |
| JP | 2001-189312 | 5/2001 |
| JP | 2001-172767 | 6/2001 |
| WO | WO 98/20524 | 5/1998 |
| WO | WO 00/16377 | 3/2000 |
| WO | WO 00/54320 | 9/2000 |
| WO | WO 01/15220 | 3/2001 |
| WO | WO 01/17692 | 3/2001 |
| WO | WO 01/29893 | 4/2001 |
| WO | WO 01/40541 | 6/2001 |
| WO | WO 01/41544 | 6/2001 |
| WO | WO 01/66832 | 9/2001 |
| WO | WO 02/43115 | 5/2002 |
| WO | WO 02/45167 | 6/2002 |
| WO | WO 02/064853 | 8/2002 |
| WO | WO 02/065508 | 8/2002 |
| WO | WO 02/065516 | 8/2002 |
| WO | WO 02/065517 | 8/2002 |
| WO | WO 02/065525 | 8/2002 |
| WO | WO 02/080244 | 10/2002 |
| WO | WO 02/097864 | 12/2002 |
| WO | WO 2004/027844 | 4/2004 |
| WO | WO 2005/071719 | 8/2005 |
| WO | WO 2006/060543 | 6/2006 |
| WO | WO 2008/033186 | 3/2008 |
| WO | WO 2007/112058 | 11/2008 |

OTHER PUBLICATIONS

Bedair, S.M., "Atomic Layer Epitaxy Deposition Processes," J. Vac. Sci. Technol. B., vol. 12, No. 1, Jan./Feb. 1994.

Choi, et al., "Stability of $TiB_2$ as a Diffusion Barrier on Silicon," J. Electrochem. Soc., vol. 138, No. 10, Oct. 1991.

Choi, et al., The Effect of Annealing on Resistivity of Low Pressure Chemical Vapor Deposited Titanium Diboride, J. Appl. Phys. 69(11), Jun. 1, 1991.

Derbyshire, K., "Applications of Integrated Processing," Solid State Technology, Dec. 1994 pp. 45-48.

Elers, et al., "$NbCl_5$ as a Precursor in Atomic Layer Epitaxy," Applied Surface Science 82/83 (1994) pp. 468-474.

George, et al., "Surface Chemistry for Atomic Layer Growth," J. Phys. Chem. 1996, 100, pp. 13121-13131.

Hwang, et al., "Nanometer-Size a-$PbO_2$-Type $TiO_2$ in Garnet: A Thermobarometer for Ultrahigh Pressure Metamorphism," Science Vo. 288 (Apr. 14, 2000) pp. 321-324.

Jeong, et al., "Growth and Characterization of Aluminum Oxide ($Al_2O_3$) Thin Films by Plasma Assisted Atomic Layer Controlled Deposition," J. Korean Inst. Met. Mater., vol. 38, No. 10, Oct. 2000 pp. 1395-1399.

Jeong, et al., "Plasma-assisted Atomic Layer Growth of High-Quality Aluminum Oxide Thin Films," Jpn. J. Appl. Phys. 1, Regul. Pap. Short Notes, vol. 40, No. 1, Jan. 2001 pp. 285-289.

Lee, et al., "Cyclic Technique for the Enhancement of Highly Oriented Diamond Film Growth," Thin Solid Films 303 (1997) pp. 264-269.

Min, et al., "Chemical Vapor Deposition of Ti-Si-N Films with Alternating Source Supply," Mat. Res. Soc. Symp. Proc. vol. 564 (1999) pp. 207-210.

Min, et al., "Metal-organic Atomic-layer Deposition of Titanium-silicon-nitride Films," Applied Physics Letters, vol. 75, No. 11 (Sep. 11, 1999) pp. 1521-1523.

Paranjpe, et al., "Atomic Layer Deposition of $AlO_x$ for Thin Film Head Gap Applications," J. Electrochem. Soc., vol. 148, No. 9, Sep. 2001 pp. G465-G471.

Ritala, et al., "Atomic Layer Deposition of Oxide Thin Films with Metal Alkoxides as Oxygen Sources," Science vol. 288 Apr. 14, 2000 pp. 319-321.

International Search Report mailed Feb. 22, 2005 for PCT/US2004/030872 (AMAT/8539-PCT).

Kamins, et al., "Kinetics of selective epitaxial deposition of $Si_{1-x}Ge_x$", Applied Physics Letters, American Institute of Physics. New York, US, vol. 61, No. 6, Aug. 10, 1992, pp. 669-671.

Menon, et al., "Loading effect in SiGe layers grown by dichlorosilane- and silane-based epitaxy", Journal of Applied Physics, American Institute of Physics. New York, US, vol. 90, No. 9, Nov. 1, 2001, pp. 4805-4809.

Sedgwick, et al., "Selective SiGe and heavily As doped Si deposited at low temperature by atmospheric pressure chemical vapor deposition", Journal of Vacuum Science and Technology: Part B, American Institute of Physics. New York, US, vol. 11, No. 3, May 1, 1993, pp. 1124-1128.

Uchino, et al., "A Raised Source/Drain Technology Using In-situ P-doped SiGe and B-doped Si for 0.1 μm CMOS ULSIs", Electron Devices Meeting, 1997. Technical Digest, International Washington, DC, USA Dec. 7-10, 1991, New York, NY, USA, IEEE, US, Dec. 7, 1997, pp. 479-482.

Maruno et al., "Selective Epitaxial Growth by Ultrahigh-Vacuum Chemical Vapor Deposition with Alternating Gas Supply of $Si_2H_6$ and $Cl_2$", Nov. 2000. Jpn. J. Appl. Phys. vol. 39, Part 1, No. 11, pp. 6139-6142.

Kim et al., "Low temperature selectivity Si epitaxy by reduced pressure chemical vapor deposition introducing periodic deposition and etching cycles with $SiH_4$, $H_2$ and HCI", Mat. Res. Soc. Symp. Proc., pp. A8.2.1-A8.2.6 (2000).

Mercier, et al., "Kinetic Aspects of Selective Epitaxial Growth Using a Rapid Thermal Processing System", Journal or Crystal Growth, 94, pp. 885-894 (1989).

Miyauchi, et al., "Low-Temperature (850° C.) Silicon Selective Epitaxial Growth on IIF-Treated Si(100) Substrates Using $SiH_4$-$HCl$-$H_2$ Systems", J. Electrochem. Soc., vol. 138, No. 11, Nov. 1991, pp. 3480-3483.

Ribot, et al., "Low-temperature selective epitaxy of silicon with chlorinated chemistry by RTCVD", Materials Science and Engineering B89, pp. 306-309 (2002).

Waite, A.M. at al., "Raised Source/Drains for 50nm MOSFETs Using A Silane/Dischlorosilane Mixture For Selective Epitaxy", Received on Jan. 7, 2004, Elsevier Ltd.—Solid-State Electronics 49 (2005), pp. 529-534.

Office Action of China Application No. 200580043510.6 mailed Nov. 29, 2008.

International Search Report and Written Opinion dated Aug. 8, 2008, relating to International Application No. PCT/US07/08541.

International Search Report and Written Opinion dated Jun. 13, 2008, relating to International Application No. PCT/US07/08549.

International Search Report and Written Opinion dated Aug. 15, 2008, relating to International Application No. PCT/US07/07363.

U.S. Office Action issued Dec. 3, 2008 in U.S. Appl. No. 11/830,830.

Waites "Raised Sources/Drains for 50 nm MOSFETS using a silane/dichlorosilane mixture for selective epitaxy", Solid State Electronics 49 (2005) pp. 529-534.

International Search Report of PCT/US07/17053 dated Dec. 6, 2007.

International Search Report of PCT/US05/043420 dated Jul. 17, 2006.

International Search Report and Written Opinion of International Application No. PCT/US05/42991 mailed Nov. 20, 2006.

International Preliminary Report on Patentability of PCT/US05/042991 issued Jun. 5, 2007.

International Preliminary Report on Patentability of PCT/US05/043420 issued Jun. 14, 2007.

International Preliminary Report on Patentability of PCT/US07/017053 issued Feb. 12, 2009.

Office Action of U.S. Appl. No. 11/830,830 mailed Dec. 3, 2008.

Mar. 3, 2009 Response to Office Action of U.S. Appl. No. 11/830,830 mailed Dec. 3, 2008.

Notice of Allowance of U.S. Appl. No. 11/830,830 mailed May 15, 2009.

Preliminary Amendment of U.S. Appl. No. 11/227,974 mailed Oct. 16, 2007.

Office Action of U.S. Appl. No. 11/227,974 mailed Nov. 16, 2007.

May 16, 2008 Response to Office Action of U.S. Appl. No. 11/227,974 mailed Nov. 16, 2007.

Final Office Action of U.S. Appl. No. 11/227,974 mailed Jul. 29, 2008.

Dec. 29, 2008 Response to Final Office Action of U.S. Appl. No. 11/227,974 mailed Jul. 29, 2008.

Notice of Allowance of U.S. Appl. No. 11/227,974 mailed Feb. 9, 2009.

Notice of Allowance of U.S. Appl. No. 11/227,974 mailed Apr. 1, 2009.

Notice of Allowance of U.S. Appl. No. 11/227,974 mailed Jul. 6, 2009.

Office Action of U.S. Appl. No. 11/690,588 mailed Aug. 19, 2008.

Jan. 19, 2009 Response to Office Action of U.S. Appl. No. 11/690,588 mailed Aug. 19, 2008.

Notice of Allowance of U.S. Appl. No. 11/690,588 mailed Feb. 17, 2009.

Notice of Allowance of U.S. Appl. No. 11/690,588 mailed Jun. 8, 2009.

Preliminary Amendment of U.S. Appl. No. 11/227,974 mailed Oct. 2, 2009.

Notice of Allowance of U.S. Appl. No. 11/227,974 mailed Oct. 19, 2009.

Office Action and Search Report of Taiwan Patent Application No. 094142363 issued Jul. 13, 2009.

* cited by examiner

USE OF CL2 AND/OR HCL DURING SILICON EPITAXIAL FILM FORMATION

This application is a continuation of and claims priority from U.S. patent application Ser. No. 11/227,974, filed Sep. 14, 2005 which is a continuation-in-part of and claims priority from U.S. patent application Ser. No. 11/001,774, filed Dec. 1, 2004, now U.S. Pat. No. 7,312,128 each of which is hereby incorporated by reference herein in its entirety.

BACKGROUND OF THE INVENTION

1. Field of the Invention

Embodiments of the invention generally relate to the field of electronic manufacturing processes and devices, more particular, to methods of depositing silicon-containing films while forming electronic devices.

2. Description of the Related Art

As smaller transistors are manufactured, ultra shallow source/drain junctions are becoming more challenging to produce. Generally, sub-100 nm CMOS (complementary metal-oxide semiconductor) devices require a junction depth to be less than 30 nm. Selective epitaxial deposition is often utilized to form epilayers of silicon-containing materials (e.g., Si, SiGe and SiC) into the junctions. Generally, selective epitaxial deposition permits growth of epilayers on silicon moats with no growth on dielectric areas. Selective epitaxy can be used within semiconductor devices, such as elevated source/drains, source/drain extensions, contact plugs or base layer deposition of bipolar devices.

Generally, a selective epitaxy process involves a deposition reaction and an etch reaction. The deposition and etch reactions occur simultaneously with relatively different reaction rates to an epitaxial layer and to a polycrystalline layer. During the deposition process, the epitaxial layer is formed on a monocrystalline surface while a polycrystalline layer is deposited on at least a second layer, such as an existing polycrystalline layer and/or an amorphous layer. However, the deposited polycrystalline layer is generally etched at a faster rate than the epitaxial layer. Therefore, by changing the concentration of an etchant gas, the net selective process results in deposition of epitaxy material and limited, or no, deposition of polycrystalline material. For example, a selective epitaxy process may result in the formation of an epilayer of silicon-containing material on a monocrystalline silicon surface while no deposition is left on the spacer.

Selective epitaxy deposition of silicon-containing materials has become a useful technique during formation of elevated source/drain and source/drain extension features, for example, during the formation of silicon-containing MOSFET (metal oxide semiconductor field effect transistor) devices. Source/drain extension features are manufactured by etching a silicon surface to make a recessed source/drain feature and subsequently filling the etched surface with a selectively grown epilayers, such as a silicon germanium (SiGe) material. Selective epitaxy permits near complete dopant activation with in-situ doping, so that the post annealing process is omitted. Therefore, junction depth can be defined accurately by silicon etching and selective epitaxy. On the other hand, the ultra shallow source/drain junction inevitably results in increased series resistance. Also, junction consumption during silicide formation increases the series resistance even further. In order to compensate for junction consumption, an elevated source/drain is epitaxially and selectively grown on the junction. Typically, the elevated source/drain layer is undoped silicon.

However, current selective epitaxy processes have some drawbacks. In order to maintain selectivity during present epitaxy processes, chemical concentrations of the precursors, as well as reaction temperatures must be regulated and adjusted throughout the deposition process. If not enough silicon precursor is administered, then the etching reaction may dominate and the overall process is slowed down. Also, harmful over etching of substrate features may occur. If not enough etchant precursor is administered, then the deposition reaction may dominate reducing the selectivity to form monocrystalline and polycrystalline materials across the substrate surface. Also, current selective epitaxy processes usually require a high reaction temperature, such as about 800° C., 1,000° C. or higher. Such high temperatures are not desirable during a fabrication process due to thermal budget considerations and possible uncontrolled nitridation reactions to the substrate surface.

Therefore, there is a need to have a process for selectively and epitaxially depositing silicon and silicon-containing compounds with optional dopants. Furthermore, the process should be versatile to form silicon-containing compounds with varied elemental concentrations while having a fast deposition rate and maintaining a process temperature, such as about 800° C. or less, and preferably about 700° C. or less.

SUMMARY OF THE INVENTION

In a first aspect of the invention, a first method of forming an epitaxial film on a substrate is provided. The first method includes (a) providing a substrate; (b) exposing the substrate to at least a silicon source so as to form an epitaxial film on at least a portion of the substrate; and (c) exposing the substrate to HCl and Cl2 so as to etch the epitaxial film and any other films formed during step (b).

In a second aspect of the invention, a second method of forming an epitaxial film on a substrate is provided. The second method includes (a) providing a substrate; (b) exposing the substrate to a silicon source and a carbon source so as to form a carbon-containing silicon epitaxial film; (c) encapsulating the carbon-containing silicon epitaxial film with an encapsulating film; and (d) exposing the substrate to Cl2 so as to etch the encapsulating film.

In a third aspect of the invention, a third method of forming an epitaxial film on a substrate is provided. The third method includes (a) providing a substrate; (b) exposing the substrate to a silicon source and an additional element source so as to form an additional element containing silicon epitaxial film; (c) encapsulating the additional element containing silicon epitaxial film with an encapsulating film; and (d) exposing the substrate to Cl2 so as to etch the encapsulating film. Numerous other aspects are provided in accordance with these and other embodiments of the invention.

Other features and aspects of the present invention will become more fully apparent from the following detailed description, the appended claims and the accompanying drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
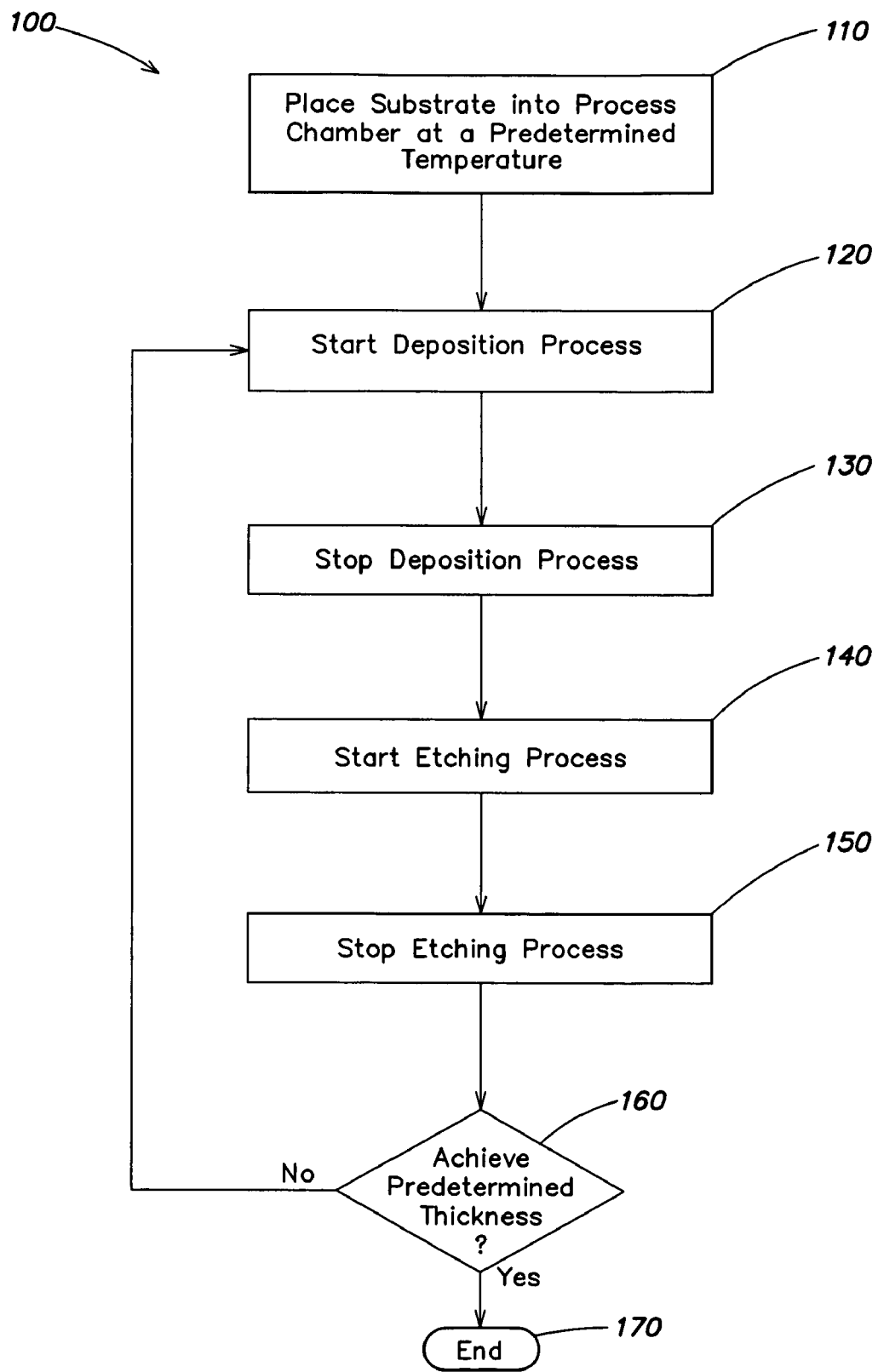
FIG. 1 is a flow chart describing a process to selectively and epitaxially deposit silicon-containing materials in at least one embodiment described herein.

The introduction of carbon into silicon epitaxial films may produce beneficial electrical properties such as improving the electrical characteristics of the channel of a metal oxide semiconductor field effect transistor (MOSFET). However, such beneficial electrical properties generally are achieved when carbon is substitutionally, rather than interstitially, incorporated within a silicon lattice. At substrate processing temperatures of about 600 degrees Celsius or less, most carbon atoms are substitutionally incorporated into a silicon lattice during an epitaxial formation process. At higher substrate temperatures, such as about 700 degrees Celsius or more, significant interstitial carbon incorporation may occur. For this reason, it is desirable to employ substrate temperatures below about 700 degrees Celsius, and more preferably substrate temperatures below about 600 degrees Celsius, when forming carbon-containing silicon epitaxial films.

Conventional silicon epitaxial film formation processes employ H2, HCl and a silicon source such as dichlorosilane and are performed at a substrate temperature above about 700 degrees Celsius (e.g., to dissociate HCl and/or the silicon source). One approach to reduce the epitaxial film formation temperature is to employ Cl2 in place of HCl, as Cl2 dissociates efficiently at lower temperatures (e.g., about 600 degrees Celsius or less). Because of incompatibility between hydrogen and Cl2, a carrier gas other than hydrogen, such as nitrogen, may be employed with Cl2. Similarly, a silicon source having a lower dissociation temperature may be employed (e.g., silane, disilane, etc.).

The present inventors have found that the use of Cl2 as the etchant gas for a silicon epitaxial film formation process may lead to poor surface morphology of the resultant silicon epitaxial film. While not wishing to be bound by any particular theory, it is believed that Cl2 may overagressively attack a silicon epitaxial film surface, producing pitting or the like. The use of Cl2 has been found to be particularly problematic when the silicon epitaxial film contains carbon.

The present invention provides methods for employing Cl2 as an etchant gas during a silicon epitaxial film formation process that may improve epitaxial film surface morphology. The inventive methods may be used, for example, with the alternating gas supply (AGS) process described below with reference to FIGS. 1-4 and in parent application U.S. patent application Ser. No. 11/001,774, filed Dec. 1, 2004.

In some embodiments, described below with reference to FIG. 5, both Cl2 and HCl are employed during an etch phase of a silicon epitaxial film formation process. The presence of HCl appears to reduce the aggressiveness of the Cl2, even for reduced substrate temperatures at which little HCl may dissociate (e.g., about 600 degrees Celsius or less). Further, during an AGS process, HCl may be continuously flowed during deposition and etch phases of the process (e.g., to improve surface morphology) as described below with reference to FIG. 6.

As stated above, the use of Cl2 with carbon-containing silicon epitaxial films may produce epitaxial films having poor surface morphology (e.g., pitting). In some embodiments, described below with reference to FIG. 7, any carbon-containing silicon epitaxial films may be "encapsulated" prior to being exposed to Cl2 during an etch phase. A carbon-containing silicon epitaxial film may be encapsulated, for example, via a silicon epitaxial film formed without a carbon source (a "non-carbon containing silicon epitaxial film") as described below with reference to FIG. 8. These and other embodiments of the invention are described further below.

Alternative Gas Supply Epitaxial Film Formation Process

Parent application U.S. patent application Ser. No. 11/001,774, filed Dec. 1, 2004 generally provides processes to selectively and epitaxially deposit silicon-containing materials on monocrystalline surfaces of a substrate during fabrication of electronic devices. A patterned substrate containing a monocrystalline surface (e.g., silicon or silicon germanium) and at least a secondary surface, such as an amorphous surface and/or a polycrystalline surface (e.g., oxide or nitride), is exposed to an epitaxial process to form an epitaxial layer on the monocrystalline surface while forming limited or no polycrystalline layer on the secondary surfaces. The epitaxial process, also referred to as the alternating gas supply (AGS) process, includes repeating a cycle of a deposition process and an etching process until the desired thickness of an epitaxial layer is grown.

The deposition process includes exposing the substrate surface to a deposition gas containing at least a silicon source and a carrier gas. The deposition gas may also include a germanium source or carbon source, as well as a dopant source. During the deposition process, an epitaxial layer is formed on the monocrystalline surface of the substrate while a polycrystalline layer is formed on secondary surfaces, such as amorphous and/or polycrystalline surfaces. Subsequently, the substrate is exposed to an etching gas. The etching gas includes a carrier gas and an etchant, such as chlorine gas or hydrogen chloride. The etching gas removes silicon-containing materials deposited during the deposition process. During the etching process, the polycrystalline layer is removed at a faster rate than the epitaxial layer. Therefore, the net result of the deposition and etching processes forms epitaxially grown silicon-containing material on monocrystalline surfaces while minimizing growth, if any, of polycrystalline silicon-containing material on the secondary surfaces. A cycle of the deposition and etching processes may be repeated as needed to obtain the desired thickness of silicon-containing materials. The silicon-containing materials which can be deposited by embodiments of the invention include silicon, silicon germanium, silicon carbon, silicon germanium carbon, and dopant variants thereof.

In one example of the AGS process, use of chlorine gas as an etchant lowers the overall process temperature below about 800° C. In general, deposition processes may be conducted at lower temperatures than etching reactions, since etchants often need a high temperature to be activated. For example, silane may be thermally decomposed to deposit silicon at about 500° C. or less, while hydrogen chloride requires an activation temperature of about 700° C. or higher to act as an effective etchant. Therefore, if hydrogen chloride is used during an AGS process, the overall process temperature is dictated by the higher temperature required to activate the etchant. Chlorine contributes to the overall AGS process by reducing the required overall process temperature. Chlorine may be activated at a temperature as low as about 500° C. Therefore, by incorporating chlorine into the AGS process as the etchant, the overall AGS process temperature may be significantly reduced, such as by 200° C. to 300° C., over processes which use hydrogen chloride as the etchant. Also, chlorine etches silicon-containing materials faster than hydrogen chloride. Therefore, chlorine etchants increase the overall rate of the AGS process.

In another example of the AGS process, an inert gas, such as nitrogen, is used as a carrier gas during the deposition and etching processes, instead of a traditional carrier gas, such as hydrogen. The use of an inert carrier gas has several attributes during an AGS process. For one, an inert carrier gas may increase the deposition rate of the silicon-containing material. While hydrogen may be used as a carrier gas, during the deposition process, hydrogen has a tendency to adsorb or react with the substrate to form hydrogen-terminated surfaces. A hydrogen-terminated surface reacts much slower to epitaxial growth than a bare silicon surface. Therefore, the use of an inert carrier gas increases the deposition rate by not adversely effecting the deposition reaction.

Although noble gasses, such as argon or helium, may be used as an inert carrier gas, nitrogen is the economically preferred inert carrier gas. Nitrogen is generally much less expensive than hydrogen, argon or helium. One drawback that may occur from using nitrogen as a carrier gas is the nitridizing of materials on a substrate during deposition processes. However, high temperature, such as over 800° C., is required to activate nitrogen in such a manner. Therefore, nitrogen is advantageously used as an inert carrier gas in AGS processes conducted at temperatures below the nitrogen activation threshold. The combined effect of using chlorine as an etchant and nitrogen as a carrier gas greatly increases the rate of the overall AGS process.

Throughout the application, the terms "silicon-containing" materials, compounds, films or layers should be construed to include a composition containing at least silicon and may contain germanium, carbon, boron, arsenic, phosphorous gallium and/or aluminum. Other elements, such as metals, halogens or hydrogen may be incorporated within a silicon-containing material, compound, film or layer, usually in part per million (ppm) concentrations. Compounds or alloys of silicon-containing materials may be represented by an abbreviation, such as Si for silicon, SiGe, for silicon germanium, SiC for silicon carbon and SiGeC for silicon germanium carbon. The abbreviations do not represent chemical equations with stoichiometrical relationships, or any particular reduction/oxidation state of the silicon-containing materials.

FIG. 1 illustrates an example of epitaxial process 100 used to deposit a silicon-containing layer. The process 100 includes step 110 for loading a patterned substrate into a process chamber and adjusting the conditions within the process chamber to a desired temperature and pressure. Step 120 provides a deposition process to form an epitaxial layer on a monocrystalline surface of the substrate while forming a polycrystalline layer on the amorphous and/or polycrystalline surfaces of the substrate. During step 130, the deposition process is terminated. Step 140 provides an etching process to etch the surface of the substrate. Preferably, the polycrystalline layer is etched at a faster rate than the epitaxial layer. The etching step either minimizes or completely removes the polycrystalline layer while removing only a marginal portion of the epitaxial layer. During step 150, the etching process is terminated. The thickness of the epitaxial layer and the polycrystalline layer, if any, is determined during step 160. If the predetermined thickness of the epitaxial layer or the polycrystalline layer is achieved, then epitaxial process 100 is terminated at step 170. However, if the predetermined thickness is not achieved, then steps 120-160 are repeated as a cycle until the predetermined thickness is achieved.

A patterned substrate is loaded in to a process chamber during step 110. Patterned substrates are substrates that include electronic features formed into or onto the substrate surface. The patterned substrate usually contains monocrystalline surfaces and at least one secondary surface that is non-monocrystalline, such as polycrystalline or amorphous surfaces. Monocrystalline surfaces include the bare crystalline substrate or a deposited single crystal layer usually made from a material such as silicon, silicon germanium or silicon carbon. Polycrystalline or amorphous surfaces may include dielectric materials, such as oxides or nitrides, specifically silicon oxide or silicon nitride, as well as amorphous silicon surfaces.

Epitaxial process 100 begins by adjusting the process chamber containing the patterned substrate to a predetermined temperature and pressure during step 110. The temperature is tailored to the particular conducted process. Generally, the process chamber is maintained at a consistent temperature throughout epitaxial process 100. However, some steps may be performed at varying temperatures. The process chamber is kept at a temperature in the range from about 250° C. to about 1,000° C., preferably from about 500° C. to about 800° C. and more preferably from about 550° C. to about 750° C. The appropriate temperature to conduct epitaxial process 100 may depend on the particular precursors used to deposit and/or etch the silicon-containing materials during steps 120 and 140. In one example, it has been found that chlorine ($Cl_2$) gas works exceptionally well as an etchant for silicon-containing materials at temperatures lower than processes using more common etchants. Therefore, in one example, a preferred temperature to pre-heat the process chamber is about 750° C. or less, preferably about 650° C. or less and more preferably about 550° C. or less. The process chamber is usually maintained at a pressure from about 0.1 Torr to about 200 Torr, preferably from about 1 Torr to about 50 Torr. The pressure may fluctuate during and between process steps 110-160, but is generally maintained constant.

The deposition process is conducted during step 120. The patterned substrate is exposed to a deposition gas to form an epitaxial layer on the monocrystalline surface while forming a polycrystalline layer on the secondary surfaces. The substrate is exposed to the deposition gas for a period of time of about 0.5 seconds to about 30 seconds, preferably from about 1 second to about 20 seconds, and more preferably from about 5 seconds to about 10 seconds. The specific exposure time of the deposition process is determined in relation to the exposure time during the etching process in step 140, as well as particular precursors and temperature used in the process. Generally, the substrate is exposed to the deposition gas long enough to form a maximized thickness of an epitaxial layer while forming a minimal thickness of a polycrystalline layer that may be easily etched away during subsequent step 140.

The deposition gas contains at least a silicon source and a carrier gas, and may contain at least one secondary elemental source, such as a germanium source and/or a carbon source. Also, the deposition gas may further include a dopant compound to provide a source of a dopant, such as boron, arsenic, phosphorous, gallium and/or aluminum. In an alternative embodiment, the deposition gas may include at least one etchant, such as hydrogen chloride or chlorine.

The silicon source is usually provided into the process chamber at a rate in a range from about 5 sccm to about 500 sccm, preferably from about 10 sccm to about 300 sccm, and more preferably from about 50 sccm to about 200 sccm, for example, about 100 sccm. Silicon sources useful in the deposition gas to deposit silicon-containing compounds include silanes, halogenated silanes and organosilanes. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X'_ySi_xH_{(2x+2-y)}$, where X'=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$) $SiH_3$), methyldisilane (($CH_3$) $Si_2H_5$), dimethyldisilane (($CH_3$)$_2Si_2H_4$) and hexamethyldisilane (($CH_3$)$_6Si_2$). Organosilane compounds have been found to be advantageous silicon sources as well as carbon sources in embodiments which incorporate carbon in the deposited silicon-containing compound. The preferred silicon sources include silane, dichlorosilane and disilane.

The silicon source is usually provided into the process chamber along with a carrier gas. The carrier gas has a flow rate from about 1 slm (standard liters per minute) to about 100 slm, preferably from about 5 slm to about 75 slm, and more preferably from about 10 slm to about 50 slm, for example, about 25 slm. Carrier gases may include nitrogen ($N_2$), hydrogen ($H_2$), argon, helium and combinations thereof. An inert carrier gas is preferred and includes nitrogen, argon, helium and combinations thereof. A carrier gas may be selected based on the precursor(s) used and/or the process temperature during the epitaxial process 100. Usually the carrier gas is the same throughout each of the steps 110-150. However, some embodiments may use different carrier gases in particular steps. For example, nitrogen may be used as a carrier gas with the silicon source in step 120 and with the etchant in step 140.

Preferably, nitrogen is utilized as a carrier gas in embodiments featuring low temperature (e.g., <800° C.) processes. Low temperature processes are accessible due in part to the use of chlorine gas in the etching process further discussed in step 140. Nitrogen remains inert during low temperature deposition processes. Therefore, nitrogen is not incorporated into the deposited silicon-containing material during low temperature processes. Also, a nitrogen carrier gas does not form hydrogen-terminated surfaces as does a hydrogen carrier gas. The hydrogen-terminated surfaces formed by the adsorption of hydrogen carrier gas on the substrate surface inhibit the growth rate of silicon-containing layers. Finally, the low temperature processes may take economic advantage of nitrogen as a carrier gas, since nitrogen is far less expensive than hydrogen, argon or helium.

The deposition gas used during step 120 may also contain at least one secondary elemental source, such as a germanium source and/or a carbon source. The germanium source may be added to the process chamber with the silicon source and carrier gas to form a silicon-containing compound, such as a silicon germanium material. The germanium source is usually provided into the process chamber at a rate in the range from about 0.1 sccm to about 20 sccm, preferably from about 0.5 sccm to about 10 sccm, and more preferably from about 1 sccm to about 5 sccm, for example, about 2 sccm. Germanium sources useful to deposit silicon-containing compounds include germane ($GeH_4$), higher germanes and organogermanes. Higher germanes include compounds with the empirical formula $Ge_xH_{(2x+2)}$, such as digermane ($Ge_2H_6$), trigermane ($Ge_3H_8$) and tetragermane ($Ge_4H_{10}$), as well as others. Organogermanes include compounds such as methylgermane (($CH_3$)$GeH_3$), dimethylgermane (($CH_3$)$_2GeH_2$), ethylgermane (($CH_3CH_2$)$GeH_3$), methyldigermane (($CH_3$)$Ge_2H_5$), dimethyldigermane (($CH_3$)$_2Ge_2H_4$) and hexamethyldigermane (($CH_3$)$_6Ge_2$). Germanes and organogermane compounds have been found to be advantageous germanium sources and carbon sources in embodiments while incorporating germanium and carbon into the deposited silicon-containing compounds, namely SiGe and SiGeC compounds. The germanium concentration in the epitaxial layer is in the range from about 1 at % to about 30 at %, for example, about 20 at %. The germanium concentration may be graded within an epitaxial layer, preferably graded with a higher germanium concentration in the lower portion of the epitaxial layer than in the upper portion of the epitaxial layer.

Alternatively, a carbon source may be added during step 120 to the process chamber with the silicon source and carrier gas to form a silicon-containing compound, such as a silicon carbon material. A carbon source is usually provided into the process chamber at a rate in the range from about 0.1 sccm to about 20 sccm, preferably from about 0.5 sccm to about 10 sccm, and more preferably from about 1 sccm to about 5 sccm, for example, about 2 sccm. Carbon sources useful to deposit silicon-containing compounds include organosilanes, alkyls, alkenes and alkynes of ethyl, propyl and butyl. Such carbon sources include methylsilane ($CH_3SiH_3$), dimethylsilane (($CH_3$)$_2SiH_2$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others. The carbon concentration of an epitaxial layer is in the range from about 200 ppm to about 5 at %, preferably from about 1 at % to about 3 at %, for example 1.5 at %. In one embodiment, the carbon concentration may be graded within an epitaxial layer, preferably graded with a lower carbon concentration in the initial portion of the epitaxial layer than in the final portion of the epitaxial layer. Alternatively, a germanium source and a carbon source may both be added during step 120 into the process chamber with the silicon source and carrier gas to form a silicon-containing compound, such as a silicon germanium carbon material.

The deposition gas used during step 120 may further include at least one dopant compound to provide a source of elemental dopant, such as boron, arsenic, phosphorous, gallium or aluminum. Dopants provide the deposited silicon-containing compounds with various conductive characteristics, such as directional electron flow in a controlled and desired pathway required by the electronic device. Films of the silicon-containing compounds are doped with particular dopants to achieve the desired conductive characteristic. In one example, the silicon-containing compound is doped p-type, such as by using diborane to add boron at a concentration in the range from about $10^{15}$ atoms/cm$^3$ to about $10^{21}$ atoms/cm$^3$. In one example, the p-type dopant has a concentration of at least 5×10$^{19}$ atoms/cm$^3$. In another example, the p-type dopant is in the range from about 1×10$^{20}$ atoms/cm$^3$ to about 2.5×10$^{21}$ atoms/cm$^3$. In another example, the silicon-containing compound is doped n-type, such as with phosphorous and/or arsenic to a concentration in the range from about 10$^{15}$ atoms/cm$^3$ to about 10$^{21}$ atoms/cm$^3$.

A dopant source is usually provided into the process chamber during step 120 at a rate in the range from about 0.1 sccm to about 20 sccm, preferably from about 0.5 sccm to about 10 sccm, and more preferably from about 1 sccm to about 5 sccm, for example, about 2 sccm. Boron-containing dopants useful as a dopant source include boranes and organoboranes. Boranes include borane, diborane ($B_2H_6$), triborane, tetraborane and pentaborane, while alkylboranes include compounds with the empirical formula $R_xBH_{(3-x)}$, where R=methyl, ethyl, propyl or butyl and x=1, 2 or 3. Alkylboranes include trimethylborane (($CH_3$)$_3$B), dimethylborane (($CH_3$)$_2$BH), triethylborane (($CH_3CH_2$)$_3$B) and diethylborane (($CH_3CH_2$)$_2$BH). Dopants may also include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3$)$_3$P), dimethylphosphine (($CH_3$)$_2$PH), triethylphosphine (($CH_3CH_2$)$_3$P) and diethylphosphine (($CH_3CH_2$)$_2$PH). Aluminum and gallium dopant sources may include alkylated and/or halogenated derivates, such as described with the empirical formula $R_xMX_{(3-x)}$, where M=Al or Ga, R=methyl, ethyl, propyl or butyl, X=Cl or F and x=0, 1, 2 or 3. Examples of aluminum and gallium dopant sources include trimethylaluminum ($Me_3Al$), triethylaluminum ($Et_3Al$), dimethylaluminumchloride ($Me_2AlCl$), aluminum chloride ($AlCl_3$), trimethylgallium ($Me_3Ga$), triethylgallium ($Et_3Ga$), dimethylgalliumchloride ($Me_2GaCl$) and gallium chloride ($GaCl_3$).

During step 130, the deposition process is terminated. In one example, the process chamber may be flushed with a purge gas or the carrier gas and/or the process chamber may be evacuated with a vacuum pump. The purging and/or evacuating processes remove excess deposition gas, reaction by-products and other contaminates. In another example, once the deposition process has terminated, the etching process in step 140 is immediately started without purging and/or evacuating the process chamber.

The etching process in step 140 removes silicon-containing materials deposited during step 120 from the substrate surface. The etching process removes both epitaxial or monocrystalline materials and amorphous or polycrystalline materials. Polycrystalline layers, if any, deposited on the substrate surface are removed at a faster rate than the epitaxial layers. The time duration of the etching process is balanced with the time duration of the deposition process to result in net deposition of the epitaxial layer selectively formed on desired areas of the substrate. Therefore, the net result of the deposition process in step 120 and etching process in step 140 is to form selective and epitaxially grown silicon-containing material while minimizing, if any, growth of polycrystalline silicon-containing material.

During step 140, the substrate is exposed to the etching gas for a period of time in the range from about 10 seconds to about 90 seconds, preferably, from about 20 seconds to about 60 seconds, and more preferably from about 30 seconds to about 45 seconds. The etching gas includes at least one etchant and a carrier gas. The etchant is usually provided into the process chamber at a rate in the range from about 10 sccm to about 700 sccm, preferably from about 50 sccm to about 500 sccm, and more preferably from about 100 sccm to about 400 sccm, for example, about 200 sccm. The etchant used in the etching gas may include chlorine ($Cl_2$), hydrogen chloride (HCl), boron trichloride ($BCl_3$), carbon tetrachloride ($CCl_4$), chlorotrifluoride ($ClF_3$) and combinations thereof. Preferably, chlorine or hydrogen chloride is used as the etchant.

The etchant is usually provided into the process chamber with a carrier gas. The carrier gas has a flow rate in the range from about 1 slm to about 100 slm, preferably from about 5 slm to about 75 slm, and more preferably from about 10 slm to about 50 slm, for example, about 25 slm. Carrier gases may include nitrogen ($N_2$), hydrogen ($H_2$), argon, helium and combinations thereof. In some embodiment, an inert carrier gas is preferred and includes nitrogen, argon, helium and combinations thereof. A carrier gas may be selected based upon specific precursor(s) and/or temperature used during the epitaxial process 100. The same carrier gas is usually used throughout each of the steps 110-150. However, some embodiments may use a different carrier gas during the etching process as used in the deposition process. In one embodiment, the preferred etchant is chlorine gas, especially when the AGS process is conducted at a low temperature (e.g., <800° C.). For example, an etching gas contains chlorine as an etchant and nitrogen as a carrier gas and is exposed to the substrate surface at a temperature in a range from about 500° C. to about 750° C. In another example, an etching gas containing chlorine and nitrogen is exposed to the substrate surface at a temperature in a range from about 250° C. to about 500° C.

The etching process is terminated during step 150. In one example, the process chamber may be flushed with a purge gas or the carrier gas and/or the process chamber may be evacuated with a vacuum pump. The purging and/or evacuating processes remove excess etching gas, reaction by-products and other contaminates. In another example, once the etching process has terminated, step 160 is immediately started without purging and/or evacuating the process chamber.

The thicknesses of the epitaxial layer and the polycrystalline layer may be determined during step 160. If the predetermined thicknesses are achieved, then epitaxial process 100 is terminated at step 170. However, if the predetermined thicknesses are not achieved, then steps 120-160 are repeated as a cycle until the desired thicknesses are achieved. The epitaxial layer is usually grown to have a thickness at a range from about 10 Å to about 2,000 Å, preferably from about 100 Å to about 1,500 Å, and more preferably from about 400 Å to about 1,200 Å, for example, about 800 Å. The polycrystalline layer is usually deposited with a thickness, if any, in a range from an atomic layer to about 500 Å. The desired or predetermined thickness of the epitaxial silicon-containing layer or the polycrystalline silicon-containing layer is specific to a particular fabrication process. In one example, the epitaxial layer may reach the predetermined thickness while the polycrystalline layer is too thick. The excess polycrystalline layer may be further etched by repeating steps 140-160 while skipping steps 120 and 130.

Figure 2A:
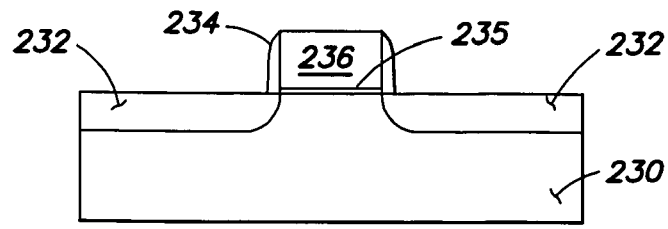
FIGS. 2A-2E show schematic illustrations of fabrication techniques for a source/drain extension device within a MOSFET.
Figure 2B:
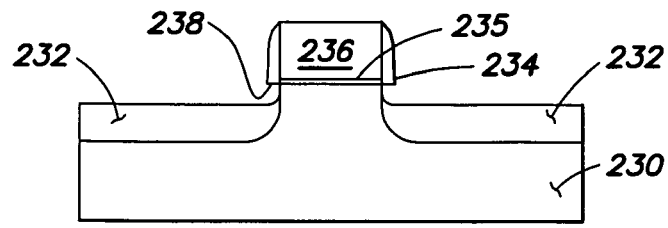

In one example, as depicted in FIGS. 2A-2E, a source/drain extension is formed within a MOSFET device wherein the silicon-containing layers are epitaxially and selectively deposited on the surface of the substrate. FIG. 2A depicts a source/drain region 232 formed by implanting ions into the surface of a substrate 230. The segments of source/drain region 232 are bridged by the gate 236 formed on gate oxide layer 235 and spacer 234. In order to form a source/drain extension, a portion of the source/drain region 232 is etched and wet-cleaned to produce a recess 238, as in FIG. 2B.

Etching of the gate 236 may be avoided by depositing a hardmask prior to etching the portion of source/drain region 232.

Figure 2C:
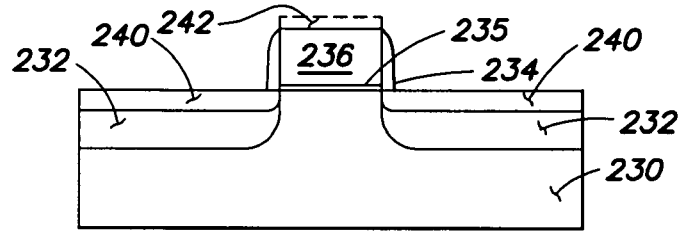

FIG. 2C illustrates one embodiment of an epitaxial process described herein, in which a silicon-containing epitaxial layer 240 and optional polycrystalline layer 242 are simultaneously and selectively deposited without depositing on the spacer 234. Polycrystalline layer 242 is optionally formed on gate 236 by adjusting the deposition and etching processes in steps 120 and 140 of epitaxial process 100. Alternatively, polycrystalline layer 242 is continually etched away from gate 236 as epitaxial layer 240 is deposited on the source/drain region 232.

In another example, silicon-containing epitaxial layer 240 and polycrystalline layer 242 are SiGe-containing layers with a germanium concentration in a range from about 1 at % to about 50 at %, preferably about 24 at % or less. Multiple SiGe-containing layers containing varying amounts of silicon and germanium may be stacked to form silicon-containing epitaxial layer 240 with a graded elemental concentration. For example, a first SiGe-layer may be deposited with a germanium concentration in a range from about 15 at % to about 25 at % and a second SiGe-layer may be deposited with a germanium concentration in a range from about 25 at % to about 35 at %.

In another example, silicon-containing epitaxial layer 240 and polycrystalline layer 242 are SiC-containing layers with a carbon concentration in a range from about 200 ppm to about 5 at %, preferably about 3 at % or less, preferably, from about 1 at % to about 2 at %, for example, about 1.5 at %. In another embodiment, silicon-containing epitaxial layer 240 and polycrystalline layer 242 are SiGeC-containing layers with a germanium concentration in the range from about 1 at % to about 50 at %, preferably about 24 at % or less and a carbon concentration at about 200 ppm to about 5 at %, preferably about 3 at % or less, more preferably from about 1 at % to about 2 at %, for example, about 1.5 at %.

Multiple layers containing Si, SiGe, SiC or SiGeC may be deposited in varying order to form graded elemental concentrations within the silicon-containing epitaxial layer 240. The silicon-containing layers are generally doped with a dopant (e.g., boron, arsenic, phosphoric, gallium or aluminum) having a concentration in the range from about $1 \times 10^{19}$ atoms/cm$^3$ to about $2.5 \times 10^{21}$ atoms/cm$^3$, preferably from about $5 \times 10^{19}$ atoms/cm$^3$ to about $2 \times 10^{20}$ atoms/cm$^3$. Dopants added to individual layers of the silicon-containing material form graded dopants. For example, silicon-containing epitaxial layer 240 is formed by depositing a first SiGe-containing layer with a dopant concentration (e.g., boron) in a range from about $5 \times 10^{19}$ atoms/cm$^3$ to about $1 \times 10^{20}$ atoms/cm$^3$ and a second SiGe-containing layer with a dopant concentration (e.g., boron) in a range from about $1 \times 10^{20}$ atoms/cm$^3$ to about $2 \times 10^{20}$ atoms/cm$^3$.

Figure 2D:
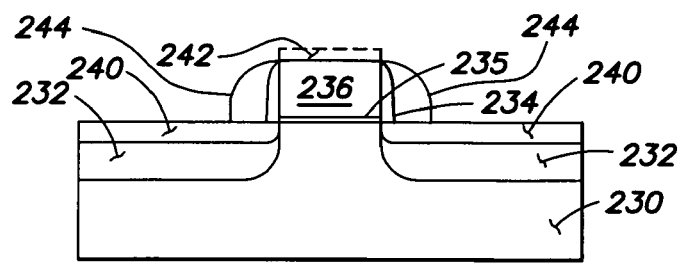

During the next step, FIG. 2D shows a spacer 244, generally a nitride spacer (e.g., Si$_3$N$_4$) deposited on the spacer 234. Spacer 244 is usually deposited in a different chamber by a CVD or ALD technique. Therefore, the substrate is removed from the process chamber that was used to deposit silicon-containing epitaxial layer 240. During the transfer between the two chambers, the substrate may be exposed to ambient conditions, such as the temperature, pressure or the atmospheric air containing water and oxygen. Upon depositing the spacer 244, or performing other semiconductor process (e.g., anneal, deposition or implant), the substrate may be exposed to ambient conditions a second time prior to depositing elevated layer 248. In one embodiment, an epitaxial layer (not shown) with no or minimal germanium (e.g., less than about 5 at %) is deposited on the top of epitaxial layer 240 before exposing the substrate to ambient conditions since native oxides are easier to remove from epitaxial layers containing minimal germanium concentrations than from an epitaxial layer formed with a germanium concentration greater than about 5 at %.

Figure 2E:
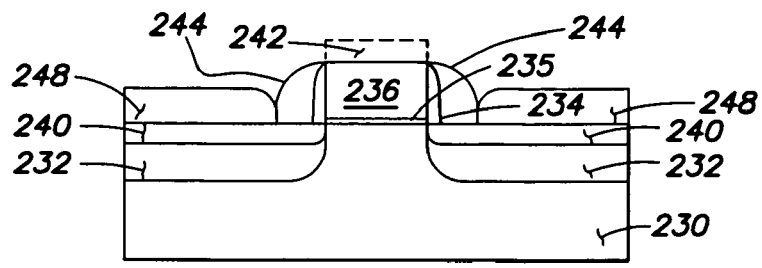

FIG. 2E depicts another example in which an elevated layer 248 comprised of a silicon-containing material is selectively and epitaxially deposited on epitaxial layer 240 (e.g., doped-SiGe). During the deposition process, polycrystalline layer 242 is further grown, deposited or etched away on the gate 236.

In a preferred embodiment, elevated layer 248 is epitaxial deposited silicon containing little or no germanium or carbon. However, in an alternative embodiment, elevated layer 248 does contain germanium and/or carbon. For example, elevated layer 248 may have about 5 at % or less of germanium. In another example, elevated layer 248 may have about 2 at % or less of carbon. Elevated layer 248 may also be doped with a dopant, such as boron, arsenic, phosphorous, aluminum or gallium.

Silicon-containing compounds are utilized within embodiments of the processes to deposit silicon-containing layers used for Bipolar device fabrication (e.g., base, emitter, collector, emitter contact), BiCMOS device fabrication (e.g., base, emitter, collector, emitter contact) and CMOS device fabrication (e.g., channel, source/drain, source/drain extension, elevated source/drain, substrate, strained silicon, silicon on insulator and contact plug). Other embodiments of processes teach the growth of silicon-containing layers that can be used as gate, base contact, collector contact, emitter contact, elevated source/drain and other uses.

Figure 3A:
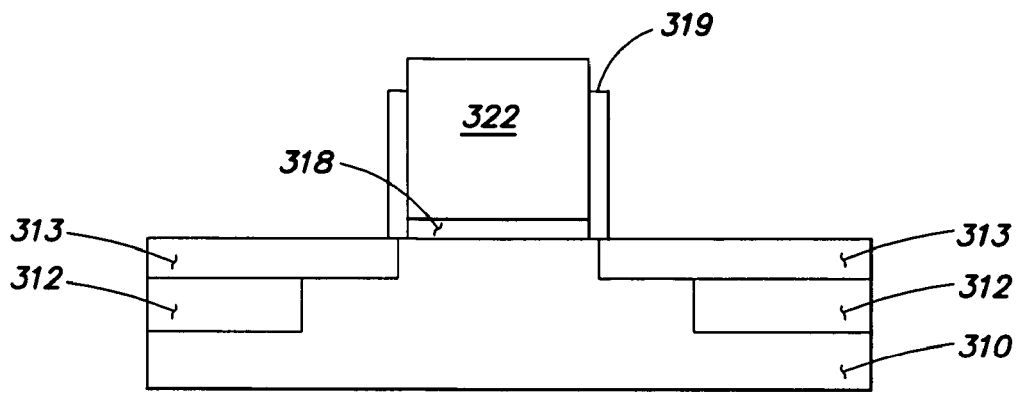
FIGS. 3A-C show several devices containing selectively and epitaxially deposited silicon-containing layers by applying embodiments described herein.
Figure 3B:
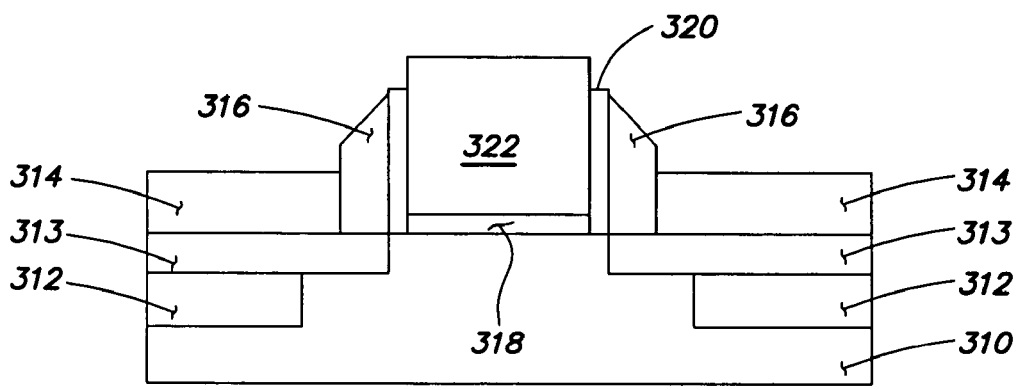
Figure 3C:
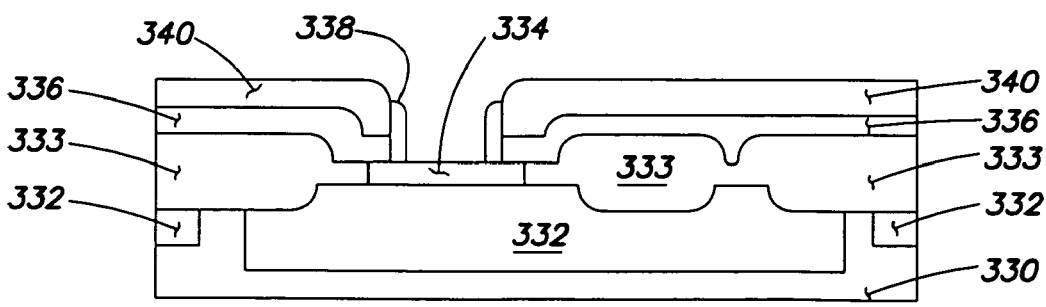

The processes are extremely useful for depositing selective, epitaxial silicon-containing layers in MOSFET and bipolar transistors as depicted in FIGS. 3A-3C. FIGS. 3A-3B show the epitaxially grown silicon-containing compounds on a MOSFET device. The silicon-containing compound is deposited on the source/drain features of the device. The silicon-containing compound adheres and grows from the crystal lattice of the underlying layer and maintains this arrangement as the silicon-containing compound is grown to a desired thickness. FIG. 3A demonstrates the silicon-containing compound deposited as a recessed source/drain layer, while FIG. 3B shows silicon-containing compounds deposited as recessed source/drain layer and an elevated source/drain layer.

The source/drain region 312 is formed by ion implantation. Generally, the substrate 310 is doped n-type while the source/drain region 312 is doped p-type. Silicon-containing epitaxial layer 313 is selectively grown on the source/drain region 312 and/or directly on substrate 310. Silicon-containing epitaxial layer 314 is selectively grown on the silicon-containing layer 313 according to aspects herein. A gate oxide layer 318 bridges the segmented silicon-containing layer 313. Generally, gate oxide layer 318 is composed of silicon dioxide, silicon oxynitride or hafnium oxide. Partially encompassing the gate oxide layer 318 is a spacer 316, which is usually an isolation material such as a nitride/oxide stack (e.g., Si$_3$N$_4$/SiO$_2$/Si$_3$N$_4$). Gate layer 322 (e.g., polysilicon) may have a protective layer 319, such as silicon dioxide, along the perpendicular sides, as in FIG. 3A. Alternately, gate layer 322 may have a spacer 316 and off-set layers 320 (e.g., Si$_3$N$_4$) disposed on either side.

In another example, FIG. 3C depicts the deposited silicon-containing epitaxial layer 334 as a base layer of a bipolar transistor. Silicon-containing epitaxial layer 334 is selectively grown with the various embodiments of the invention.

Silicon-containing epitaxial layer 334 is deposited on an n-type collector layer 332 previously deposited on substrate 330. The transistor further includes isolation layer 333 (e.g., $SiO_2$ or $Si_3N_4$), contact layer 336 (e.g., heavily doped poly-Si), off-set layer 338 (e.g., $Si_3N_4$), and a second isolation layer 340 (e.g., $SiO_2$ or $Si_3N_4$).

Figure 4:
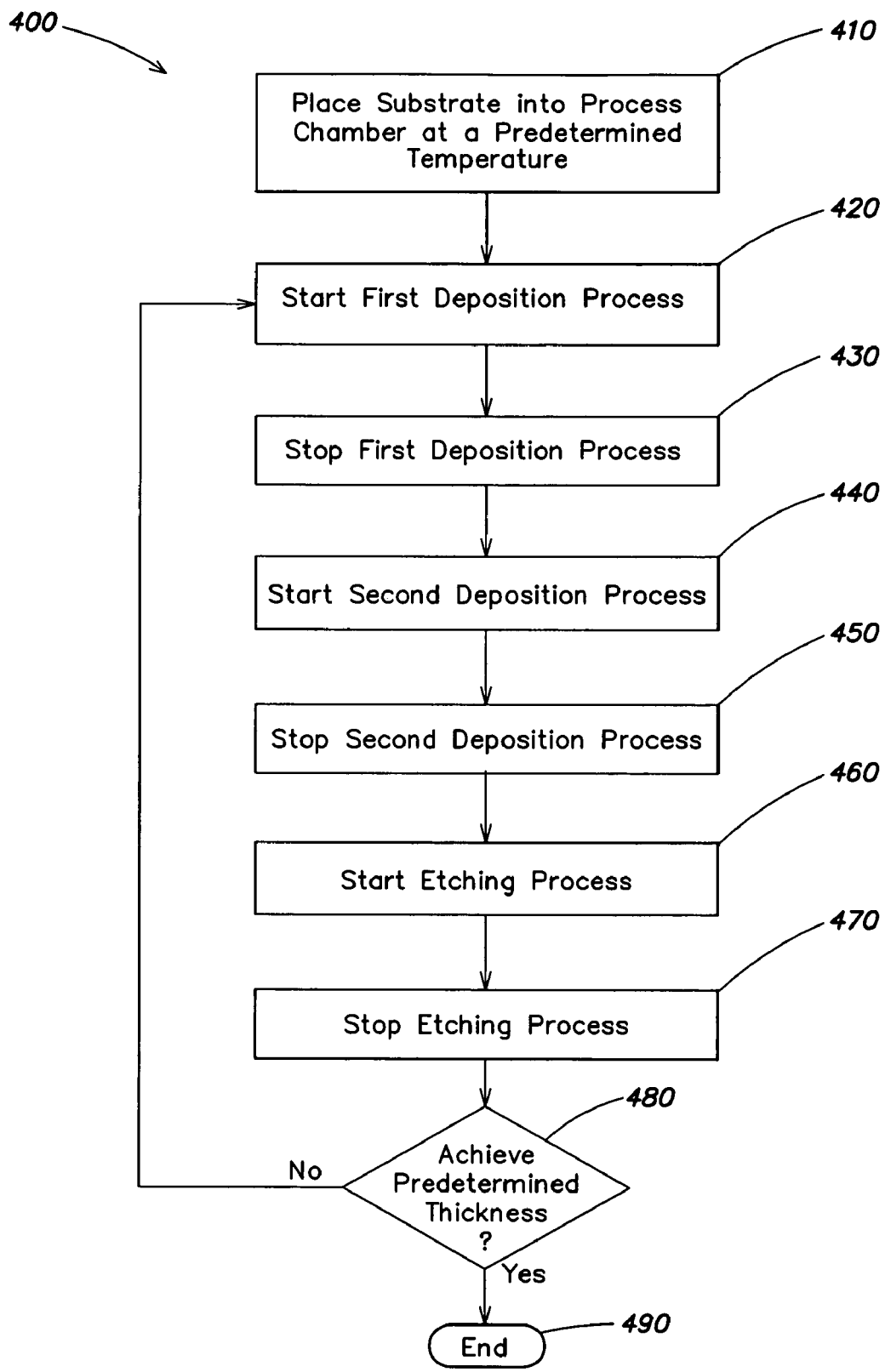
FIG. 4 is a flow chart describing a process to selectively and epitaxially deposit silicon-containing materials in another embodiment described herein.

In an alternative embodiment, FIG. 4 illustrates an epitaxial process 400 that may be used to selectively deposit silicon-containing materials/layer. Epitaxial process 400 includes at least two deposition processes followed by an etching process. The first deposition process includes a deposition gas containing a silicon source while the second deposition process includes a deposition gas containing a secondary elemental source, such as germanium, carbon or a dopant (e.g., boron, arsenic, phosphorous, gallium or aluminum). Similar process parameters used in epitaxial process 100 are used in epitaxial process 400, such as temperatures, pressures, flow rates, carrier gases and precursors.

Epitaxial process 400 includes step 410 for loading a patterned substrate into the process chamber and adjusting the process chamber to a predetermined temperature. Step 420 provides a first deposition process to form an epitaxial layer on a monocrystalline surface while forming a polycrystalline layer on secondary surfaces, such as amorphous and/or polycrystalline surfaces. The epitaxial layer and the monocrystalline layer are formed from a deposition gas containing a silicon source. During step 430, the first deposition process is terminated. Step 440 provides a second deposition process to continue growing the epitaxial layer on a monocrystalline surface and continue forming the polycrystalline layer on the secondary surface. The epitaxial layer and the polycrystalline layer are further grown by exposing the substrate surface to a deposition gas containing a secondary elemental source. At step 450, the second deposition process is terminated. Step 460 provides an etching process to etch the exposed silicon-containing layers. The etching process either minimizes or completely removes the polycrystalline layer while removing only a marginal portion of the epitaxial layer as a result of the rate at which each material is removed. During step 470, the etching process is terminated. The thicknesses of the epitaxial layer and the polycrystalline layer, if any, are determined during step 480. If the predetermined thickness is achieved, then epitaxial process 400 is terminated at step 490. However, if the predetermined thickness of either layer is not achieved, then steps 420-480 are repeated as a cycle until the predetermined thicknesses are achieved.

Epitaxial process 400 starts at step 410 by adjusting the process chamber containing the patterned substrate to a predetermined temperature. The temperature and pressure is tailored to the particular process conducted. Generally, the process chamber is maintained at a consistent temperature throughout epitaxial process 400. However, some steps may be performed at varying temperatures. The process chamber is kept at a temperature in the range from about 250° C. to about 1,000° C., preferably from about 500° C. to about 800° C. and more preferably from about 550° C. to about 750° C. The appropriate temperature to conduct epitaxial process 400 may depend on the particular precursors used to deposit and/or etch the silicon-containing materials during steps 420-480. In one embodiment, it has been found that chlorine ($Cl_2$) gas works exceptionally well as an etchant for silicon-containing materials at temperatures lower than processes using other more common etchants. Therefore, in one embodiment a preferred temperature to pre-heat the process chamber is about 750° C. or less, preferably about 650° C. or less and more preferably about 550° C. or less. The process chamber is usually maintained with a pressure from about 0.1 Torr to about 200 Torr, preferably from about 1 Torr to about 50 Torr. The pressure may fluctuate during and between process steps 410-480, but is generally maintained constant.

The first deposition process is conducted during step 420. The patterned substrate is exposed to a first deposition gas to form an epitaxial layer on the monocrystalline surface while forming a polycrystalline layer on the secondary surfaces. The substrate is exposed to the first deposition gas for a period of time of about 0.5 seconds to about 30 seconds, preferably from about 1 second to about 20 seconds, and more preferably from about 5 seconds to about 10 seconds. The specific exposure time of the deposition process is determined in relation to the exposure time during the etching process in step 460, as well as particular precursors and temperature used in the process. Generally, the substrate is exposed to the first deposition gas long enough to form the maximized thickness of an epitaxial layer while forming the minimized thickness of a polycrystalline layer that may be easily etched away during subsequent step 460.

The first deposition gas contains at least a silicon source and a carrier gas. The first deposition gas may also contain a secondary elemental source and/or a dopant compound, but preferably, the secondary elemental source and the dopant compound are in the second deposition gas. Therefore, in one aspect, the first deposition gas may contain a silicon source, a secondary elemental source and a dopant source. In another aspect, the first deposition gas may contain a silicon source and a secondary elemental source. In yet another aspect, the first deposition gas may contain a silicon source and a dopant source. In an alternative embodiment, the first deposition gas may also include at least one etchant, such as hydrogen chloride or chlorine.

The silicon source is usually provided into the process chamber at a rate in the range from about 5 sccm to about 500 sccm, preferably from about 10 sccm to about 300 sccm, and more preferably from about 50 sccm to about 200 sccm, for example, about 100 sccm. The preferred silicon sources include silane, dichlorosilane and disilane.

The silicon source is usually provided into the process chamber in a carrier gas. The carrier gas has a flow rate from about 1 slm to about 100 slm, preferably from about 5 slm to about 75 slm, and more preferably from about 10 slm to about 50 slm, for example, about 25 slm. Carrier gases may include nitrogen ($N_2$), hydrogen ($H_2$), argon, helium and combinations thereof. In some embodiment, an inert carrier gas is preferred and includes nitrogen, argon, helium and combinations thereof. Preferably, the carrier gas used throughout epitaxial process 400 is nitrogen, for reasons discussed above.

During step 430, the first deposition process is terminated. In one example, the process chamber may be flushed with a purge gas or the carrier gas and/or the process chamber may be evacuated with a vacuum pump. The purging and/or evacuating processes remove excess deposition gas, reaction by-products and other contaminates. In another example, once the first deposition process has terminated, the second deposition process in step 440 is immediately started without purging and/or evacuation the process chamber.

The deposition gas used during step 440 contains a carrier gas and at least one secondary elemental source, such as a germanium source, a carbon source and/or a dopant compound. Alternatively, a silicon source may be included in the second deposition gas. The secondary elemental source is added to the process chamber with the carrier gas to continue the growth of the silicon-containing compounds deposited during step 420. The silicon-containing compounds may have varied compositions controlled by the specific secondary elemental source and the concentration of the secondary elemental source. A secondary elemental source is usually provided into the process chamber at a rate in the range from about 0.1 sccm to about 20 sccm, preferably from about 0.5 sccm to about 10 sccm, and more preferably from about 1 sccm to about 5 sccm, for example, about 2 sccm. Germanium sources, carbon sources and dopant compounds are selected from the aforementioned precursors discussed above.

During step 450, the second deposition process is terminated. In one example, the process chamber may be flushed with a purge gas or the carrier gas and/or the process chamber may be evacuated with a vacuum pump. The purging and/or evacuating processes remove excess deposition gas, reaction by-products and other contaminates. In another example, once the second deposition process has terminated, the etching process in step 460 is immediately started without purging and/or evacuating the process chamber.

The etching process in step 460 removes materials deposited during steps 420 and 440 from the substrate surface. The etching process removes both epitaxial or monocrystalline materials and amorphous and/or polycrystalline materials. Polycrystalline layers, if any, deposited on the substrate surface is removed at a faster rate than the epitaxial layers. The time duration of the etching process is balanced with the time duration of the two deposition processes. Therefore, the net result of the deposition processes in steps 420 and 440 and etching process in step 460 is to form selective and epitaxially grown silicon-containing material while minimizing, if any, growth of polycrystalline silicon-containing material.

During step 460, the substrate is exposed to the etching gas for a period of time in a range from about 10 seconds to about 90 seconds, preferably, from about 20 seconds to about 60 seconds, and more preferably from about 30 seconds to about 45 seconds. The etching gas includes at least one etchant and a carrier gas. The etchant is usually provided into the process chamber at a rate in a range from about 10 sccm to about 700 sccm, preferably from about 50 sccm to about 500 sccm, and more preferably from about 100 sccm to about 400 sccm, for example, about 200 sccm. The etchant used in the etching gas may include chlorine ($Cl_2$), hydrogen chloride (HCl), boron trichloride ($BCl_3$), carbon tetrachloride ($CCl_4$), chlorotrifluoride ($ClF_3$) and combinations thereof. Preferably, chlorine or hydrogen chloride is used as the etchant.

The etchant is usually provided into the process chamber along with a carrier gas. The carrier gas has a flow rate in a range from about 1 slm to about 100 slm, preferably from about 5 slm to about 75 slm, and more preferably from about 10 slm to about 50 slm, for example, about 25 slm. Carrier gases may include nitrogen ($N_2$), hydrogen ($H_2$), argon, helium and combinations thereof. In some embodiment, an inert carrier gas is preferred and includes nitrogen, argon, helium and combinations thereof. A carrier gas may be selected based upon specific precursor(s) and/or temperature used during the epitaxial process 400. The same carrier gas is usually used throughout each of steps 420-480. However, some embodiments may use a different carrier gas during the etching process as used in the deposition process. In one embodiment, the preferred etchant is chlorine gas, especially when the AGS process is conducted at a low temperature (e.g., <800° C.). For example, an etching gas contains chlorine as an etchant and nitrogen as a carrier gas and is exposed to the substrate surface at a temperature in a range from about 500° C. to about 750° C.

The etching process is terminated during step 470. In one example, the process chamber may be flushed with a purge gas or the carrier gas and/or the process chamber may be evacuated with a vacuum pump. The purging and/or evacuating processes remove excess etching gas, reaction by-products and other contaminates. In another example, once the etching process has terminated, step 480 is immediately started without purging and/or evacuating the process chamber.

The thicknesses of epitaxial layer and the polycrystalline layer may be determined during step 480. If the predetermined thicknesses are achieved, then epitaxial process 400 is ended at step 490. However, if the predetermined thicknesses are not achieved, then steps 420-180 are repeated as a cycle until the desired thicknesses are achieved. The epitaxial layer is usually grown to have a thickness at a range from about 10 Å to about 2,000 Å, preferably from about 100 Å to about 1,500 Å, and more preferably from about 400 Å to about 1,200 Å, for example, about 800 Å. The polycrystalline layer is usually deposited on have a thickness, if any, at a range from about an atomic layer to about 500 Å. The desired or predetermined thickness of the epitaxial silicon-containing layer or the polycrystalline silicon-containing layer is specific to a particular fabrication process. In one example, the epitaxial layer may reach the predetermined thickness while the polycrystalline layer is too thick. The excess polycrystalline layer may be further etched by repeating steps 140-160 while omitting steps 460 and 470. Likewise, in other examples, steps 420, 440 and 460 may be individually omitted while proceeding through epitaxial process 400. By skipping steps 420, 440 and 460, the elemental concentration and the thicknesses of deposited silicon-containing materials may be controlled.

Embodiments of the invention teach processes to deposit silicon-containing compounds on a variety of substrates. Substrates on which embodiments of the invention may be useful include, but are not limited to semiconductor wafers, such as silicon (e.g., Si<100> and Si<111>), silicon oxide, silicon germanium, doped or undoped wafers and patterned or non-patterned wafers. Substrates have a variety of geometries (e.g., round, square and rectangular) and sizes (e.g., 200 mm OD, 300 mm OD).

In one embodiment, silicon-containing compounds deposited by process described herein include a germanium concentration within the range from about 0 at % to about 95 at %. In another embodiment, a germanium concentration is within the range from about 1 at % to about 30 at %, preferably from about 15 at % to about 30 at %, for example, about 20 at %. Silicon-containing compounds also include a carbon concentration within the range from about 0 at % to about 5 at %. In other aspects, a carbon concentration is within the range from about 200 ppm to about 3 at %, preferably about 1.5 at %.

The silicon-containing compound films of germanium and/or carbon are produced by various processes of the invention and can have consistent, sporadic or graded elemental concentrations. Graded silicon germanium films are disclosed in U.S. Pat. No. 6,770,134 and U.S. patent application Ser. No. 10/014,466, published as United States Patent Publication 20020174827, both assigned to Applied Materials, Inc., and are incorporated herein by reference in entirety for the purpose of describing methods of depositing graded silicon-containing compound films. In one example, a silicon source (e.g., $SiH_4$) and a germanium source (e.g., $GeH_4$) are used to selectively and epitaxially deposit silicon germanium containing films. In this example, the ratio of silicon source and germanium source can be varied in order to provide control of the elemental concentrations, such as silicon and germanium, while growing graded films. In another example, a silicon source and a carbon source (e.g., $CH_3SiH_3$) are used to selectively and epitaxially deposit silicon carbon-containing films. The ratio of silicon source and carbon source can be varied in order to provide control of the elemental concentration while growing homogenous or graded films. In another example, a silicon source, a germanium source and a carbon source are used to selectively and epitaxially deposit silicon germanium carbon-containing films. The ratios of silicon, germanium and carbon sources are independently varied in order to provide control of the elemental concentration while growing homogenous or graded films.

MOSFET devices formed by processes described herein may contain a PMOS component or a NMOS component. The PMOS component, with a p-type channel, has holes that are responsible for channel conduction, while the NMOS component, with a n-type channel, has electrons that are responsible channel conduction. Therefore, for example, a silicon-containing material such as SiGe may be deposited in a recessed area to form a PMOS component. In another example, a silicon-containing film such as SiC may be deposited in a recessed area to form a NMOS component. SiGe is used for PMOS application for several reasons. A SiGe material incorporates more boron than silicon alone, thus the junction resistivity may be lowered. Also, the SiGe/silicide layer interface at the substrate surface has a lower Schottky barrier than the Si/silicide interface.

Further, SiGe grown epitaxially on the top of silicon has compressive stress inside the film because the lattice constant of SiGe is larger than that of silicon. The compressive stress is transferred in the lateral dimension to create compressive strain in the PMOS channel and to increase mobility of the holes. For NMOS application, SiC can be used in the recessed areas to create tensile stress in the channel, since the lattice constant of SiC is smaller than that of silicon. The tensile stress is transferred into the channel and increases the electron mobility. Therefore, in one embodiment, a first silicon-containing layer is formed with a first lattice strain value and a second silicon-containing layer is formed with a second lattice strain value. For example, a SiC layer with a thickness from about 50 Å to about 200 Å is deposited on the substrate surface and sequentially, a SiGe layer with a thickness from about 150 Å to about 1,000 Å is deposited on the SiC layer. The SiC layer may be epitaxially grown and has less strain than the SiGe layer epitaxially grown on the SiC layer.

In embodiments described herein, silicon-containing compound films are selectively and epitaxially deposited by chemical vapor deposition (CVD) processes. Chemical vapor deposition processes include atomic layer deposition (ALD) processes and/or atomic layer epitaxy (ALE) processes. Chemical vapor deposition includes the use of many techniques, such as plasma-assisted CVD (PA-CVD), atomic layer CVD (ALCVD), organometallic or metalorganic CVD (OMCVD or MOCVD), laser-assisted CVD (LA-CVD), ultraviolet CVD (UV-CVD), hot-wire (HWCVD), reduced-pressure CVD (RP-CVD), ultra-high vacuum CVD (UHV-CVD) and others. In one embodiment, the preferred process is to use thermal CVD to epitaxially grow or deposit the silicon-containing compound, whereas the silicon-containing compound includes silicon, SiGe, SiC, SiGeC, doped variants thereof and combinations thereof.

The processes of the invention can be carried out in equipment known in the art of ALE, CVD and ALD. The apparatus may contain multiple gas lines to maintain the deposition gas and the etching gas separated prior to entering the process chamber. Thereafter, the gases are brought into contact with a heated substrate on which the silicon-containing compound films are grown. Hardware that can be used to deposit silicon-containing films includes the Epi Centura® system and the Poly Gen® system available from Applied Materials, Inc., located in Santa Clara, Calif. An ALD apparatus is disclosed in U.S. patent application Ser. No. 10/032,284, filed Dec. 21, 2001, published as United States Patent Publication No. 20030079686, assigned to Applied Materials, Inc., and entitled, "Gas Delivery Apparatus and Methods for ALD," and is incorporated herein by reference in entirety for the purpose of describing the apparatus. Other apparatuses include batch, high-temperature furnaces, as known in the art.

EXAMPLES

The following hypothetical examples were conducted to form an elevated source drain (ESD) structure on a substrate surface. The patterned substrates contained monocrystalline surfaces with source/drain features formed within the substrate surface and gate and spacers formed therebetween.

Example 1

Selective epitaxy of silicon with $Cl_2$ etchant—The substrate was placed into a process chamber heated and maintained at 550° C. The process chamber was maintained at a pressure of about 15 Torr. The substrate surface was exposed to a flow of deposition gas containing silane with a flow rate of 100 sccm and nitrogen with a flow rate of 25 slm for 7 seconds. The substrate was thereafter exposed to an etching gas containing chlorine gas with a flow rate of 20 sccm and nitrogen with a flow rate of 25 slm for 10 seconds. A cycle of deposition gas exposure and etching gas exposure was repeated 50 times to form an epitaxially grown silicon layer on the exposed monocrystalline portion of the substrate. The silicon epitaxial layer had a thickness of about 1,000 Å.

Example 2

Selective epitaxy of silicon germanium with $Cl_2$ etchant—The substrate was placed into a process chamber heated and maintained at 550° C. The process chamber was maintained at a pressure of about 15 Torr. The substrate surface was exposed to a flow of deposition gas containing silane with a flow rate of 100 sccm, germane with a flow rate of 3 sccm and nitrogen with a flow rate of 25 slm for 8 seconds. The substrate was thereafter exposed to an etching gas containing chlorine gas with a flow rate of 20 sccm and nitrogen with a flow rate of 25 slm for 10 seconds. A cycle of deposition gas exposure and etching gas exposure was repeated 50 times to form an epitaxially grown silicon-containing layer on the exposed monocrystalline portion of the substrate. The silicon-containing epitaxial layer had a thickness of about 1,700 Å.

Example 3

Selective epitaxy of silicon germanium with $Cl_2$ etchant—The substrate was placed into a process chamber heated and maintained at 550° C. The process chamber was maintained at a pressure of about 15 Torr. The substrate surface was exposed to a flow of deposition gas containing silane with a flow rate of 100 sccm and nitrogen with a flow rate of 25 slm for 7 seconds. The substrate surface was thereafter exposed to a flow of second deposition gas containing germane with a flow rate of 5 sccm and nitrogen with a flow rate of 25 slm for 7 seconds. The substrate was exposed to an etching gas containing chlorine gas with a flow rate of 20 sccm and nitrogen with a flow rate of 25 slm for 10 seconds. A cycle of deposition gas exposure and etching gas exposure was repeated 50 times to form an epitaxially grown silicon-containing layer on the exposed monocrystalline portion of the substrate. The silicon-containing epitaxial layer had a thickness of about 1,800 Å.

Example 4

Selective epitaxy of silicon carbon with Cl$_2$ etchant—The substrate was placed into a process chamber heated and maintained at 550° C. The process chamber was maintained at a pressure of about 15 Torr. The substrate surface was thereafter exposed to a flow of deposition gas containing silane with a flow rate of 100 sccm, methylsilane with a flow rate of 1 sccm and nitrogen with a flow rate of 25 slm for 8 seconds. The substrate was exposed to an etching gas containing chlorine gas with a flow rate of 20 sccm and nitrogen with a flow rate of 25 slm for 10 seconds. A cycle of deposition gas exposure and etching gas exposure was repeated 50 times to form an epitaxially grown silicon-containing layer on the exposed monocrystalline portion of the substrate. The silicon-containing epitaxial layer had a thickness of about 1,600 Å.

Example 5

Selective epitaxy of silicon carbon with Cl$_2$ etchant—The substrate was placed into a process chamber heated and maintained at 550° C. The process chamber was maintained at a pressure of about 15 Torr. The substrate surface was thereafter exposed to a flow of deposition gas containing silane with a flow rate of 100 sccm and nitrogen with a flow rate of 25 slm for 7 seconds. The substrate surface was exposed to a flow of second deposition gas containing methylsilane with a flow rate of 5 sccm and nitrogen with a flow rate of 25 slm for 7 seconds. The substrate was exposed to an etching gas containing chlorine gas with a flow rate of 20 sccm and nitrogen with a flow rate of 25 slm for 10 seconds. A cycle of deposition gas exposure and etching gas exposure was repeated 50 times to form an epitaxially grown silicon-containing layer on the exposed monocrystalline portion of the substrate. The silicon-containing epitaxial layer had a thickness of about 1,800 Å.

Example 6

Selective epitaxy of silicon with HCl etchant—The substrate was placed into a process chamber heated and maintained at 700° C. The process chamber was maintained at a pressure of about 15 Torr. The substrate surface was thereafter exposed to a flow of deposition gas containing silane with a flow rate of 100 sccm and hydrogen with a flow rate of 25 slm for 7 seconds. The substrate was exposed to an etching gas containing hydrogen chloride with a flow rate of 200 sccm and hydrogen with a flow rate of 25 slm for 40 seconds. A cycle of deposition gas exposure and etching gas exposure was repeated 10 times to form an epitaxially grown silicon layer on the exposed monocrystalline portion of the substrate. The silicon epitaxial layer had a thickness of about 800 Å.

Example 7

Selective epitaxy of silicon germanium with HCl etchant—The substrate was placed into a process chamber heated and maintained at 700° C. The process chamber was maintained at a pressure of about 15 Torr. The substrate surface was thereafter exposed to a flow of deposition gas containing silane with a flow rate of 100 sccm, germane with a flow rate of 3 sccm and hydrogen with a flow rate of 25 slm for 8 seconds. The substrate was exposed to an etching gas containing hydrogen chloride with a flow rate of 200 sccm and hydrogen with a flow rate of 25 slm for 40 seconds. A cycle of deposition gas exposure and etching gas exposure was repeated 20 times to form an epitaxially grown silicon-containing layer on the exposed monocrystalline portion of the substrate. The silicon-containing epitaxial layer had a thickness of about 1,500 Å.

Example 8

Selective epitaxy of silicon germanium with HCl etchant—The substrate was placed into a process chamber heated and maintained at 700° C. The process chamber was maintained at a pressure of about 15 Torr. The substrate surface was thereafter exposed to a flow of deposition gas containing silane with a flow rate of 100 sccm and hydrogen with a flow rate of 25 slm for 7 seconds. The substrate surface was exposed to a flow of second deposition gas containing germane with a flow rate of 5 sccm and hydrogen with a flow rate of 25 slm for 7 seconds. The substrate was exposed to an etching gas containing hydrogen chloride with a flow rate of 200 sccm and hydrogen with a flow rate of 25 slm for 40 seconds. A cycle of deposition gas exposure and etching gas exposure was repeated 20 times to form an epitaxially grown silicon-containing layer on the exposed monocrystalline portion of the substrate. The silicon-containing epitaxial layer had a thickness of about 1,600 Å.

Example 9

Selective epitaxy of silicon carbon with HCl etchant—The substrate was placed into a process chamber heated and maintained at 700° C. The process chamber was maintained at a pressure of about 15 Torr. The substrate surface was thereafter exposed to a flow of deposition gas containing silane with a flow rate of 100 sccm, methylsilane with a flow rate of 1 sccm and hydrogen with a flow rate of 25 slm for 8 seconds. The substrate was exposed to an etching gas containing hydrogen chloride with a flow rate of 200 sccm and hydrogen with a flow rate of 25 slm for 40 seconds. A cycle of deposition gas exposure and etching gas exposure was repeated 20 times to form an epitaxially grown silicon-containing layer on the exposed monocrystalline portion of the substrate. The silicon-containing epitaxial layer had a thickness of about 1,500 Å.

Example 10

Selective epitaxy of silicon carbon with HCl etchant—The substrate was placed into a process chamber heated and maintained at 700° C. The process chamber was maintained at a pressure of about 15 Torr. The substrate surface was thereafter exposed to a flow of deposition gas containing silane with a flow rate of 100 sccm and hydrogen with a flow rate of 25 slm for 7 seconds. The substrate surface was exposed to a flow of second deposition gas containing germane with a flow rate of 5 sccm and hydrogen with a flow rate of 25 slm for 7 seconds. The substrate was exposed to an etching gas containing hydrogen chloride with a flow rate of 200 sccm and hydrogen with a flow rate of 25 slm for 40 seconds. A cycle of deposition gas exposure and etching gas exposure was repeated 20 times to form an epitaxially grown silicon-containing layer on the exposed monocrystalline portion of the substrate. The silicon-containing epitaxial layer had a thickness of about 1,600 Å. The exposed dielectric portions of the substrate surface, such as the gate, formed either limited or no polycrystalline growth from the deposition gas.

Example 11

Selective epitaxy of silicon doped with B and etched with Cl$_2$—The substrate was placed into a process chamber heated and maintained at 550° C. The process chamber was maintained at a pressure of about 15 Torr. The substrate surface was exposed to a flow of deposition gas containing silane with a flow rate of 100 sccm, diborane with a flow rate of 3 sccm and nitrogen with a flow rate of 25 slm for 7 seconds. The substrate was thereafter exposed to an etching gas containing chlorine gas with a flow rate of 20 sccm and nitrogen with a flow rate of 25 slm for 10 seconds. A cycle of deposition gas exposure and etching gas exposure was repeated 50 times to form an epitaxially grown silicon layer on the exposed monocrystalline portion of the substrate. The silicon epitaxial layer had a thickness of about 1,000 Å.

Example 12

Selective epitaxy of silicon germanium doped with B and etched with $Cl_2$—The substrate was placed into a process chamber heated and maintained at 550° C. The process chamber was maintained at a pressure of about 15 Torr. The substrate surface was exposed to a flow of deposition gas containing silane with a flow rate of 100 sccm, germane with a flow rate of 3 sccm, diborane with a flow rate of 3 sccm and nitrogen with a flow rate of 25 slm for 8 seconds. The substrate was thereafter exposed to an etching gas containing chlorine gas with a flow rate of 20 sccm and nitrogen with a flow rate of 25 slm for 10 seconds. A cycle of deposition gas exposure and etching gas exposure was repeated 50 times to form an epitaxially grown silicon-containing layer on the exposed monocrystalline portion of the substrate. The silicon-containing epitaxial layer had a thickness of about 1,700 Å.

Example 13

Selective epitaxy of silicon germanium doped with B and etched with $Cl_2$—The substrate was placed into a process chamber heated and maintained at 550° C. The process chamber was maintained at a pressure of about 15 Torr. The substrate surface was exposed to a flow of deposition gas containing silane with a flow rate of 100 sccm, diborane with a flow rate of 3 sccm and nitrogen with a flow rate of 25 slm for 7 seconds. The substrate surface was thereafter exposed to a flow of second deposition gas containing germane with a flow rate of 5 sccm and nitrogen with a flow rate of 25 slm for 7 seconds. The substrate was thereafter exposed to an etching gas containing chlorine gas with a flow rate of 20 sccm and nitrogen with a flow rate of 25 slm for 10 seconds. A cycle of deposition gas exposure and etching gas exposure was repeated 50 times to form an epitaxially grown silicon-containing layer on the exposed monocrystalline portion of the substrate. The silicon-containing epitaxial layer had a thickness of about 1,800 Å.

Example 14

Selective epitaxy of silicon carbon doped with P and etched with $Cl_2$—The substrate was placed into a process chamber heated and maintained at 550° C. The process chamber was maintained at a pressure of about 15 Torr. The substrate surface was exposed to a flow of deposition gas containing silane with a flow rate of 100 sccm, methylsilane with a flow rate of 1 sccm, phosphine with a flow rate of 3 sccm and nitrogen with a flow rate of 25 slm for 8 seconds. The substrate was thereafter exposed to an etching gas containing chlorine gas with a flow rate of 20 sccm and nitrogen with a flow rate of 25 slm for 10 seconds. A cycle of deposition gas exposure and etching gas exposure was repeated 80 times to form an epitaxially grown silicon-containing layer on the exposed monocrystalline portion of the substrate. The silicon-containing epitaxial layer had a thickness of about 1,600 Å.

Example 15

Selective epitaxy of silicon carbon doped with P and etched with $Cl_2$—The substrate was placed into a process chamber heated and maintained at 550° C. The process chamber was maintained at a pressure of about 15 Torr. The substrate surface was exposed to a flow of deposition gas containing silane with a flow rate of 100 sccm, phosphine with a flow rate of 3 sccm and nitrogen with a flow rate of 25 slm for 7 seconds. The substrate surface was thereafter exposed to a flow of second deposition gas containing methylsilane with a flow rate of 5 sccm and nitrogen with a flow rate of 25 slm for 7 seconds. The substrate was thereafter exposed to an etching gas containing chlorine gas with a flow rate of 20 sccm and nitrogen with a flow rate of 25 slm for 10 seconds. A cycle of deposition gas exposure and etching gas exposure was repeated 80 times to form an epitaxially grown silicon-containing layer on the exposed monocrystalline portion of the substrate. The silicon-containing epitaxial layer had a thickness of about 1,800 Å.

Use of HCl and/or Cl2 During Silicon Epitaxial Film Formation

As stated, the present inventors have found that the use of Cl2 as the etchant gas for a silicon epitaxial film formation process may lead to poor surface morphology of the resultant silicon epitaxial film. While not wishing to be bound by any particular theory, it is believed that Cl2 may overaggressively attack a silicon epitaxial film surface, producing pitting or the like. The use of Cl2 has been found to be particularly problematic when the silicon epitaxial film contains carbon.

In one embodiment of the invention, both Cl2 and HCl are employed during an etch phase of a silicon epitaxial film formation process. The presence of HCl appears to reduce the aggressiveness of the Cl2, even for reduced substrate temperatures at which little HCl may dissociate (e.g., about 600 degrees Celsius or less). Further, during an AGS process, HCl may be continuously flowed during deposition and etch phases of the process (e.g., to improve surface morphology).

Figure 5:
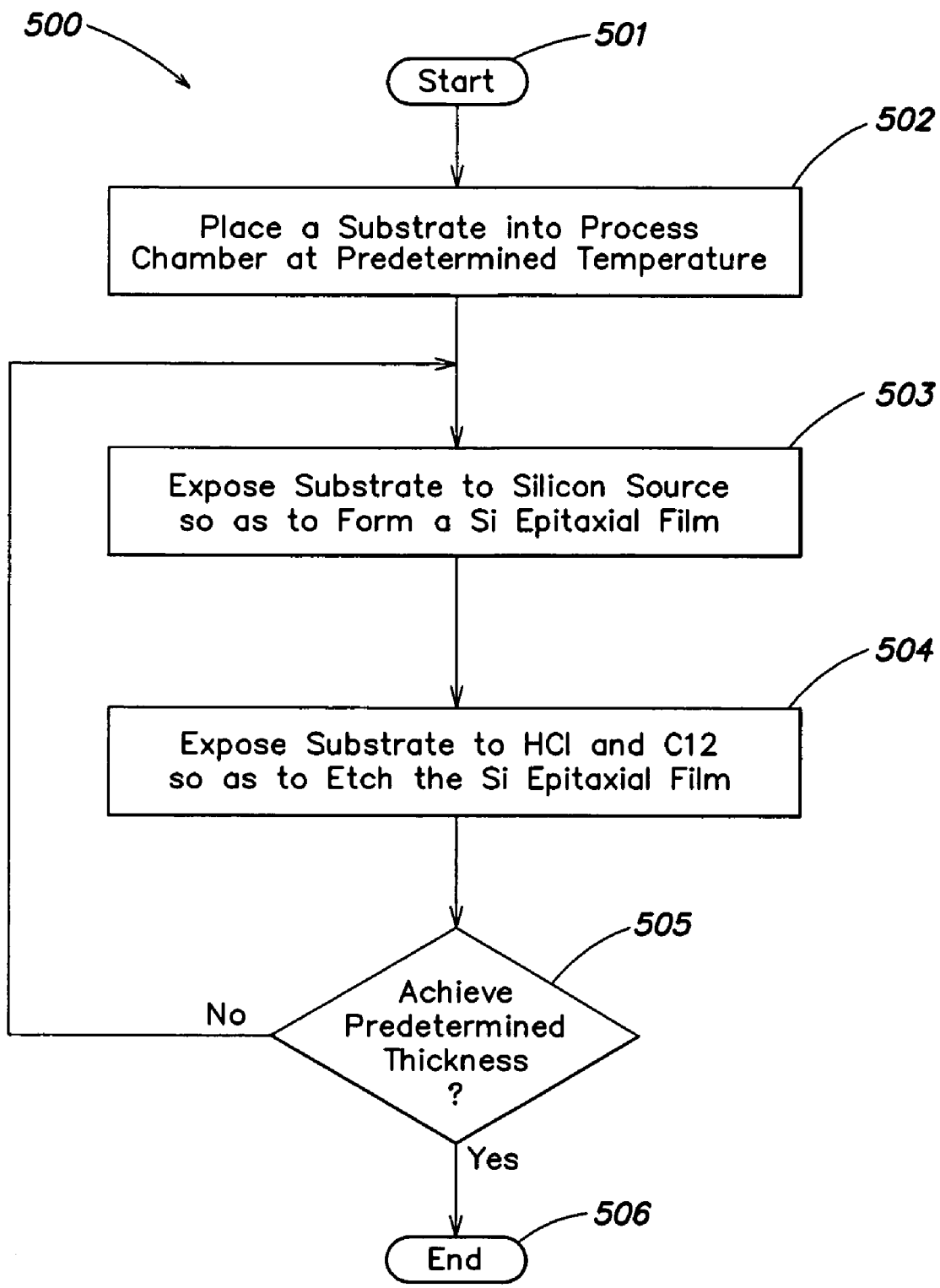
FIG. 5 is a flowchart of a first method for employing Cl2 during silicon epitaxial film formation in accordance with the present invention.

FIG. 5 is a flowchart of a first method 500 for employing Cl2 during silicon epitaxial film formation. With reference to FIG. 5, the method 500 begins with step 501. In step 502, a substrate is placed in a process chamber (not shown) adapted to form epitaxial films. The process chamber may comprise any conventional epitaxial film chamber adapted for forming epitaxial films on one or more substrates. An exemplary epitaxial film chamber may be found in the Epi Centura® system and the Poly Gen® system available from Applied Materials, Inc., located in Santa Clara, Calif., although other epitaxial film chambers and/or systems may be used.

Following placement within the process chamber, the substrate is heated to a desired substrate and/or process temperature. In at least one embodiment of the invention, a substrate and/or process temperature of less than about 700 degrees Celsius may be employed to improve carbon incorporation within any silicon epitaxial layer formed within the process chamber. In a particular embodiment, a substrate and/or process temperature range of between about 550 to 650 degrees Celsius may be used, and in yet another embodiment, a substrate and/or process temperature of less than about 600 degrees Celsius may be used. Other substrate and/or process temperatures may be used, including substrate and/or process temperatures above 700 degrees Celsius.

After the desired substrate and/or process temperature has been reached, in step 503 the substrate is exposed to at least a silicon source so as to form a silicon epitaxial film on the substrate. For example, the substrate may be exposed to a silicon source such as silane, a carrier gas such as nitrogen, a dopant source such as phosphorous or boron or the like. Any other suitable silicon source, carrier gas, dopant source, or other gas may be used, such a carbon source, a germanium source or as any of the gases previously described herein. During the epitaxial film formation process, an epitaxial layer may be formed on any monocrystalline surface of the substrate while a polycrystalline layer may be formed on any polycrystalline layer and/or any amorphous layer present on the substrate (as previously described).

In step 504 the substrate is exposed to HCl and Cl2 so as to etch the silicon epitaxial film and/or any other films formed on the substrate during step 503 (e.g., polycrystalline silicon formed on polycrystalline or amorphous layers present on the substrate). Note that the epitaxial film formed on monocrystalline surfaces of the substrate etches slower than any other films formed during step 503.

The presence of HCl during etching may reduce the aggressiveness of Cl2, even for reduced substrate and/or process temperatures at which little HCl may dissociate (e.g., about 600 degrees Celsius or less). In at least one embodiment, a substantially larger flow rate of HCl, relative to Cl2, may be employed. For example, in at least one embodiment, an HCl flow rate of approximately 6 to 10 times the flow rate of Cl2 may be used (although larger or smaller HCl/Cl2 ratios may be used). In one particular embodiment, an HCl flow rate of about 300 sccm, a Cl2 flow rate of about 30-50 sccm and a nitrogen carrier gas flow rate of about 10-50 slm (e.g., about 20-25 slm) may be used. Other flow rates/ratios may be employed.

Following etching, the process chamber may be purged (e.g., with nitrogen and/or another inert gas for about 20 seconds or for some other suitable time period) to remove any Cl2 and/or any other unwanted species/by-products from the chamber. Thereafter, in step 505, a determination is made as to whether the epitaxial film formed on the substrate is of a desired thickness. For example, the thickness of the epitaxial film may be measured or estimated based on the process times and/or other parameters used during steps 503 and/or 504. If the film is of the desired thickness, the method 500 ends at step 506; otherwise, the method 500 returns to step 503 and an additional deposition (step 503) and etch step (504) are performed on the substrate. Steps 503 and 504 may be repeated until the desired film thickness is achieved.

By using both HCl and Cl2 during step 504, the benefits of employing Cl2 as a primary etchant (e.g., low substrate and/or process temperature processing, better carbon incorporation, etc.) may be realized without degrading the surface morphology of the epitaxial films formed during the method 500.

Figure 6:
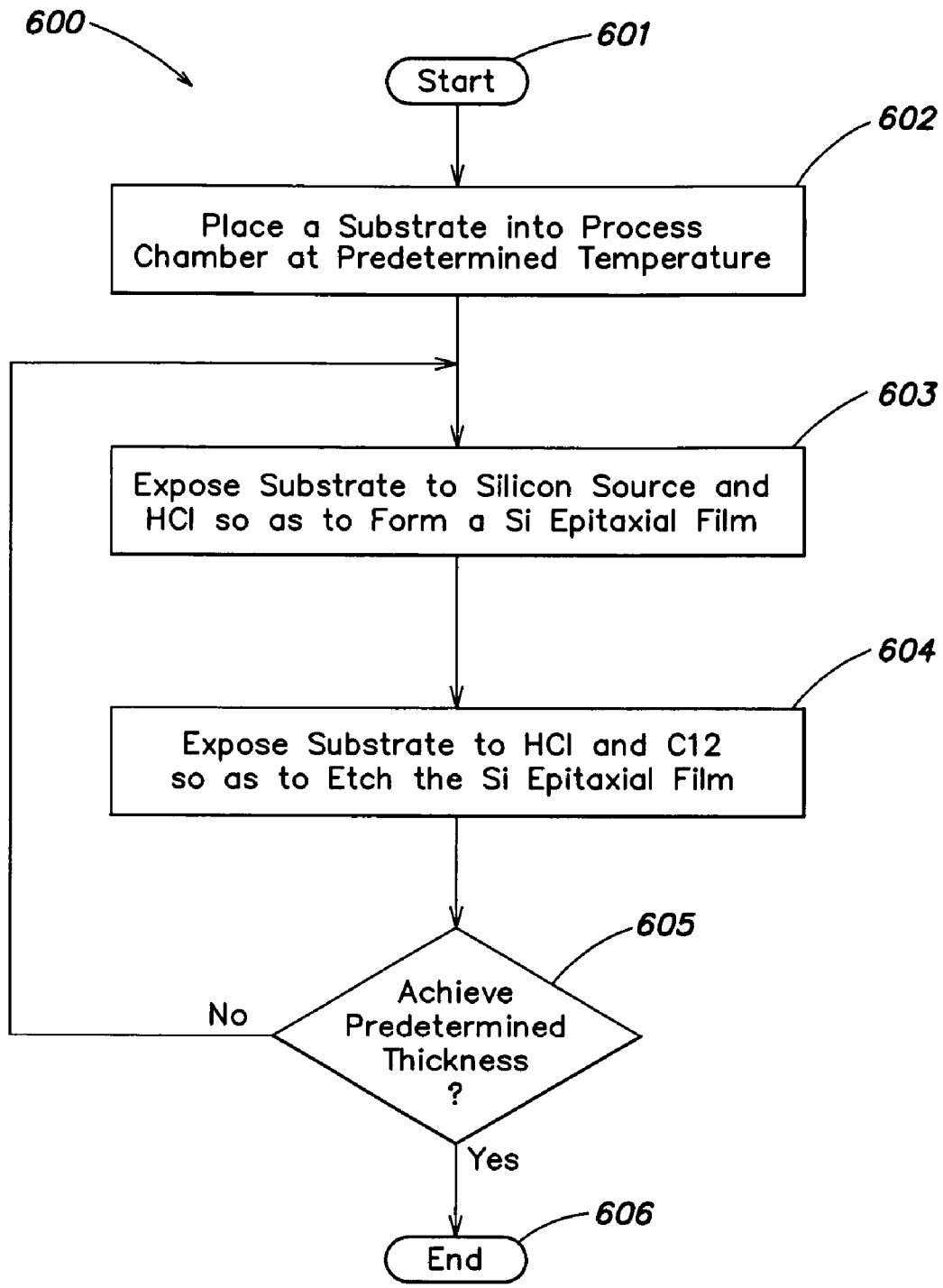
FIG. 6 is a flowchart of a second method for employing Cl2 during silicon epitaxial film formation in accordance with the present invention.

FIG. 6 is a flowchart of a second method 600 for employing Cl2 during silicon epitaxial film formation. With reference to FIG. 6, the method 600 begins with step 601. In step 602, a substrate is placed in a process chamber (not shown) adapted to form epitaxial films. The process chamber may comprise any conventional epitaxial film chamber adapted for forming epitaxial films on one or more substrates. An exemplary epitaxial film chamber may be found in the Epi Centura® system and the Poly Gen® system available from Applied Materials, Inc., located in Santa Clara, Calif., although other epitaxial film chambers and/or systems may be used.

Following placement within the process chamber, the substrate is heated to a desired substrate and/or process temperature. In at least one embodiment of the invention, a substrate and/or process temperature of less than about 700 degrees Celsius may be employed to improve carbon incorporation within any silicon epitaxial layer formed within the process chamber. In a particular embodiment, a substrate and/or process temperature range of between about 550 to 650 degrees Celsius may be used, and in yet another embodiment, a substrate and/or process temperature of less than about 600 degrees Celsius may be used. Other substrate and/or process temperatures may be used, including substrate and/or process temperatures above 700 degrees Celsius.

After the desired substrate and/or process temperature has been reached, in step 603, the substrate is exposed to at least a silicon source and HCl so as to form a silicon epitaxial film on the substrate. For example, the substrate may be exposed to a silicon source such as silane or disilane, HCl, and a carrier gas such as nitrogen. A dopant source such as phosphorous or boron, a carbon source, a germanium source or the like also may be used (as may any other suitable sources and/or gasses). During the epitaxial film formation process, an epitaxial layer may be formed on any monocrystalline surface of the substrate while a polycrystalline layer may be formed on any polycrystalline layer and/or any amorphous layer present on the substrate (as previously described). The presence of HCl during silicon epitaxial film formation may enhance the selectivity of silicon epitaxial film deposition relative to any other films formed on the substrate (e.g., polycrystalline layers) and may improve epitaxial film surface morphology.

In at least one embodiment, an HCl flow rate of approximately 300 sccm may be used with a silicon source flow rate of about 50-150 sccm for silane (or a flow rate of about 10-40 sccm for disilane) and a nitrogen carrier gas flow rate of about 10 slm-50 slm (e.g., about 20-25 slm). Larger or smaller HCl, silicon source and/or carrier gas flow rates may be used.

In step 604 the substrate is exposed to HCl and Cl2 so as to etch the epitaxial film and/or any other films formed on the substrate during step 603 (e.g., polycrystalline silicon formed on polycrystalline or amorphous layers present on the substrate). Note that the epitaxial film formed on monocrystalline surfaces of the substrate etches slower than any other films formed during step 603. As stated, the presence of HCl may reduce the aggressiveness of the Cl2, even for reduced substrate and/or process temperatures at which little HCl may dissociate (e.g., about 600 degrees Celsius or less).

In at least one embodiment, a substantially larger flow rate of HCl, relative to Cl2, may be employed. For example, in at least one embodiment, an HCl flow rate of approximately 6 to 10 times the flow rate of Cl2 may be used (although larger or smaller HCl/Cl2 ratios may be used). In one particular embodiment, an HCl flow rate of about 300 sccm, a Cl2 flow rate of about 30-50 sccm and a nitrogen carrier gas flow rate of about 20 to 25 slm may be used (although other flow rates may be employed).

Following etching, the process chamber may be purged (e.g., with nitrogen and/or another inert gas for about 20 seconds or for some other suitable time period) to remove any Cl2 and/or any other unwanted species/by-products from the chamber. Thereafter, in step 605, a determination is made as to whether the epitaxial film formed on the substrate is of a desired thickness. For example, the thickness of the epitaxial film may be measured or estimated based on the process times and/or other parameters used during steps 603 and/or 604. If the film is of the desired thickness, the method 600 ends at step 606; otherwise, the method 600 returns to step 603 and an additional deposition step (step 603) and etch step (604) are performed on the substrate. Steps 603 and 604 may be repeated until the desired film thickness is achieved.

As stated, by using both HCl and Cl2 during step 604, the benefits of employing Cl2 as a primary etchant (e.g., low substrate and/or process temperature processing, better carbon incorporation, etc.) may be realized without degrading the surface morphology of the epitaxial films formed during the method 600. Furthermore, use of HCl during step 603 may help the formation of silicon epitaxial films relative to the formation of any other films on the substrate (e.g., polycrystalline silicon). The same or a different HCl flow rate may be used in steps 603 and 604.

Figure 7:
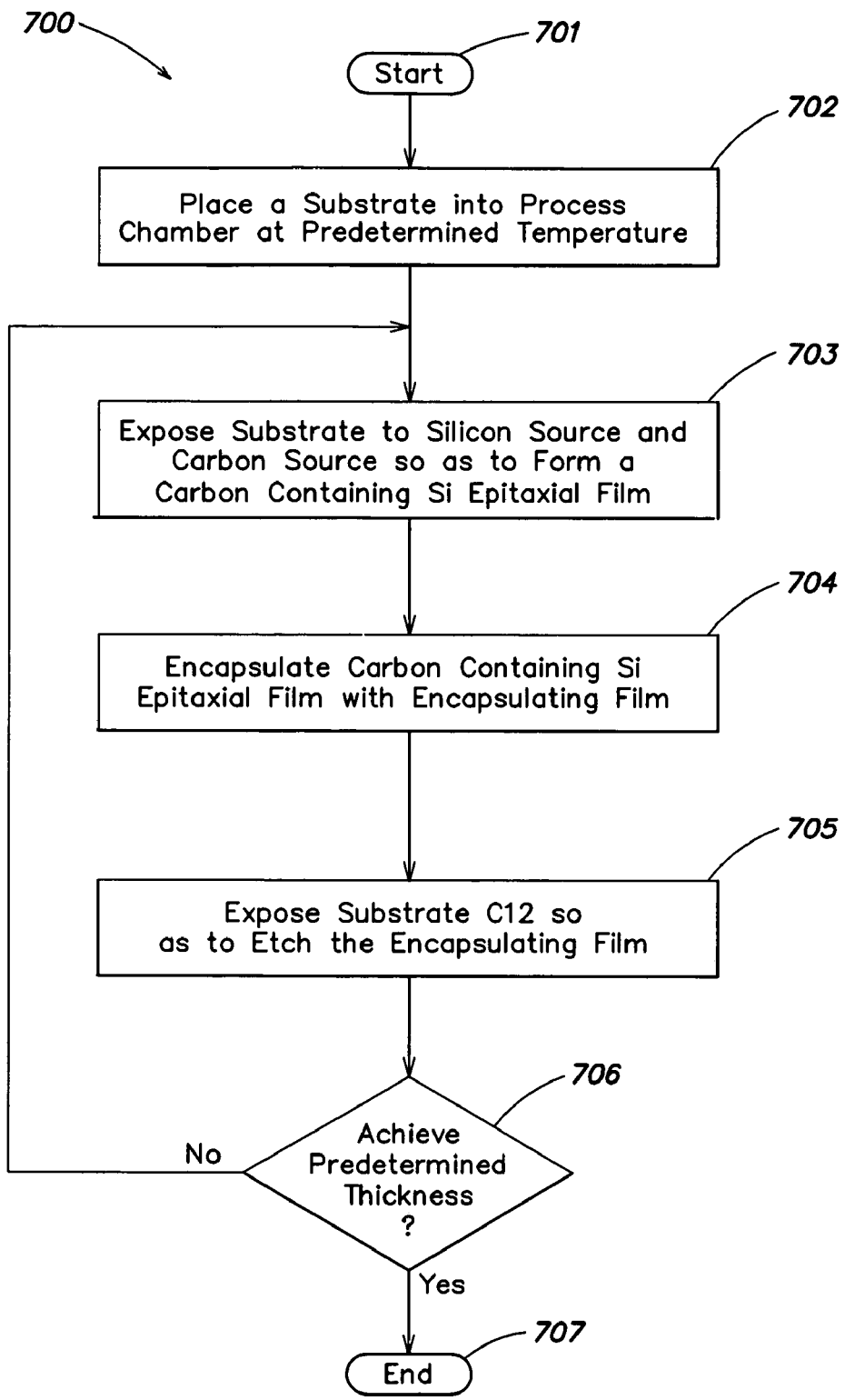
FIG. 7 is a flowchart of a third method for employing Cl2 during silicon epitaxial film formation in accordance with the present invention.

FIG. 7 is a flowchart of a third method 700 for employing Cl2 during silicon epitaxial film formation. With reference to FIG. 7, the method 700 begins with step 701. In step 702 a substrate is placed in a process chamber (not shown) adapted to form epitaxial films. The process chamber may comprise any conventional epitaxial film chamber adapted for forming epitaxial films on one or more substrates. An exemplary epitaxial film chamber may be found in the Epi Centura® system and the Poly Gen® system available from Applied Materials, Inc., located in Santa Clara, Calif., although other epitaxial film chambers and/or systems may be used.

Following placement within the process chamber, the substrate is heated to a desired substrate and/or process temperature. In at least one embodiment of the invention, a substrate and/or process temperature of less than about 700 degrees Celsius may be employed to improve carbon incorporation within any silicon epitaxial layer formed within the process chamber. In a particular embodiment, a substrate and/or process temperature range of between about 550 to 650 degrees Celsius may be used, and in yet another embodiment, a substrate and/or process temperature of less than about 600 degrees Celsius may be used. Other substrate and/or process temperatures may be used, including substrate and/or process temperatures above 700 degrees Celsius.

After the desired substrate and/or process temperature has been reached, in step 703, the substrate is exposed to at least a silicon source and a carbon source so as to form a carbon-containing silicon epitaxial film on the substrate. For example, the substrate may be exposed to a silicon source such as silane or disilane, a carbon source such as methane, a carrier gas such as nitrogen, or the like. A dopant source such as phosphorous or boron, a germanium source or the like also may be used (as may any other suitable sources and/or gasses). During the epitaxial film formation process, an epitaxial layer may be formed on any monocrystalline surface of the substrate while a polycrystalline layer may be formed on any polycrystalline layer and/or any amorphous layer present on the substrate (as previously described).

In at least one embodiment, a carbon source flow rate of about 1-5 sccm for methane may be used with a silicon source flow rate of about 50-150 sccm for silane (or of about 10-40 sccm for disilane) and a nitrogen carrier gas flow rate of about 20-25 slm (although larger or smaller carbon source, silicon source and/or carrier gas flow rates may be used). HCl may also be flowed if desired.

The carbon containing epitaxial film may have, for example, a thickness of about 10 to about 1600 angstroms, although other thickness may be used. For example, a deposition time of about 1 second to about 300 seconds, and in one or more embodiments about 10 second, may be used.

In step 704, the carbon-containing silicon epitaxial film is encapsulated with an encapsulating film. For example, the encapsulating film may be formed by exposing the substrate to a silicon source such as silane or disilane and a carrier gas such as nitrogen or the like so as to form a silicon epitaxial film (without a carbon source) over the carbon-containing silicon epitaxial film. Substrate and/or process temperatures that are similar to or that differ from the substrate and/or process temperature of step 703 may be employed. The presence of the encapsulating film over the carbon-containing silicon epitaxial film may diminish the interaction of chlorine with carbon (and/or hydrogen) in the carbon-containing silicon epitaxial film (during etching) and improve surface morphology. For example, because many carbon sources are hydrogen rich, a silicon surface exposed to a carbon source may be significantly hydrogen terminated. Such a hydrogen terminated surface may react poorly with chlorine during etching.

In at least one embodiment, a silicon epitaxial film may be employed as the encapsulating film and may be formed by flowing a silicon source at a flow rate of about 50-150 sccm for silane (or a flow rate of about 10-40 sccm for disilane) and a nitrogen carrier gas at a flow rate of about 20-25 slm (although larger or smaller silicon source and/or carrier gas flow rates may be used). HCl may also be flowed as described previously with reference to FIG. 6.

The first silicon epitaxial film may have a thickness of about 2 angstroms to about 500 angstroms, although other thickness may be used. For example, a deposition time of about 1 second to about 100 seconds, and in one or more embodiments about 5 seconds, may be used.

In step 705, the substrate is exposed to Cl2 so as to etch the encapsulating film and/or any other films formed during step 704 (e.g., polycrystalline silicon formed on polycrystalline and/or amorphous layers present on the substrate or monocrystalline silicon formed on the carbon-containing silicon epitaxial film). For example, in at least one embodiment, the substrate may be exposed to a Cl2 flow rate of about 30-50 sccm and nitrogen carrier gas flow rate of about 20-25 slm (although larger or smaller Cl2 and/or nitrogen carrier gas flow rates may be used). HCl also may be flowed as described previously with reference to FIG. 6. Other etchant and/or carrier gases may be used.

Following etching, the process chamber may be purged (e.g., with nitrogen and/or another inert gas for about 20 seconds or for some other suitable time period) to remove any Cl2 and/or any other unwanted species/by-products from the chamber. Thereafter, in step 706, a determination is made as to whether the epitaxial film formed on the substrate is of a desired thickness. For example, the thickness of the epitaxial film may be measured or estimated based on the process times and/or other parameters used during steps 703 and/or 704 and/or 705. If the film is of the desired thickness, the method 700 ends at step 707; otherwise, the method 700 returns to step 703 and an additional deposition step (step 703), encapsulating step (step 704) and etch step (step 705) are performed on the substrate. Steps 703, 704 and/or 705 may be repeated until the desired film thickness is achieved.

Figure 8:
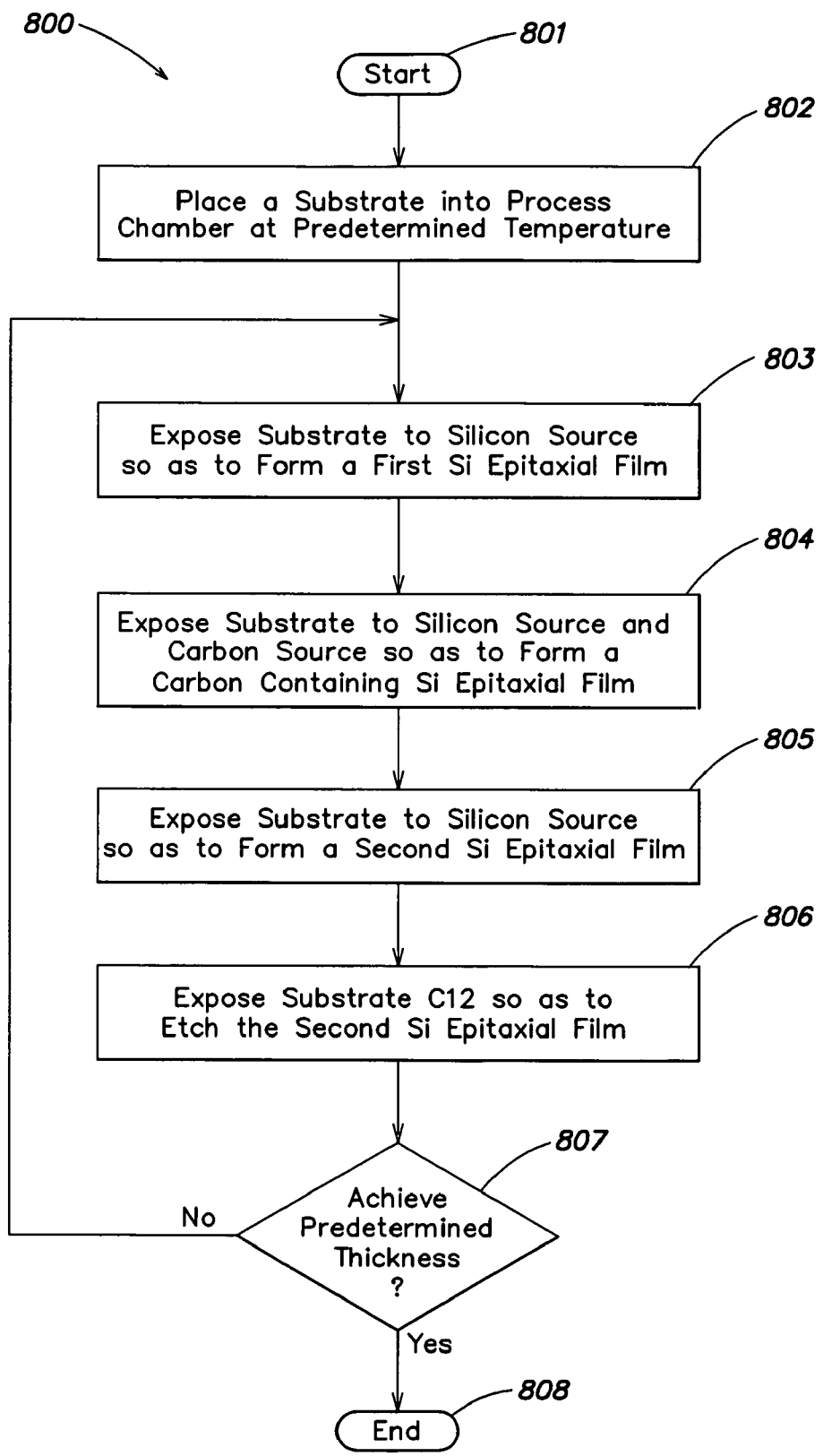
FIG. 8 is a flowchart of a fourth method for employing Cl2 during silicon epitaxial film formation in accordance with the present invention.

FIG. 8 is a flowchart of a fourth method 800 for employing Cl2 during silicon epitaxial film formation. With reference to FIG. 8, the method 800 begins with step 801. In step 802, a substrate is placed in a process chamber (not shown) adapted to form epitaxial films. The process chamber may comprise any conventional epitaxial film chamber adapted for forming epitaxial films on one or more substrates. An exemplary epitaxial film chamber may be found in the Epi Centura® system and the Poly Gen® system available from Applied Materials, Inc., located in Santa Clara, Calif., although other epitaxial film chambers and/or systems may be used.

Following placement within the process chamber, the substrate is heated to a desired substrate and/or process temperature. In at least one embodiment of the invention, a substrate and/or process temperature of less than about 700 degrees Celsius may be employed to improve carbon incorporation within any silicon epitaxial layer formed within the process chamber. In a particular embodiment, a substrate and/or process temperature range of between about 550 to 650 degrees Celsius may be used, and in yet another embodiment, a substrate and/or process temperature of less than about 600 degrees Celsius may be used. Other substrate and/or process temperatures may be used, including substrate and/or process temperatures above 700 degrees Celsius.

After the desired substrate and/or process temperature has been reached, in step 803 the substrate is exposed to at least a silicon source (without a carbon source) so as to form a first silicon epitaxial film on the substrate. For example, the substrate may be exposed to a silicon source such as silane or disilane, and a carrier gas such as nitrogen. A dopant source such as phosphorous or boron, a germanium source or the like also may be used (as may any other suitable sources and/or gasses). During the epitaxial film formation process, an epitaxial layer may be formed on any monocrystalline surface of the substrate while a polycrystalline layer may be formed on any polycrystalline layer and/or any amorphous layer present on the substrate (as previously described). HCl also may be flowed as described previously with reference to FIG. 6.

The first silicon epitaxial film may be formed, for example, by flowing a silicon source at a flow rate of about 50-150 sccm for silane (or a flow rate of about 10-40 sccm for disilane) and a nitrogen carrier gas at a flow rate of about 20-25 slm (although larger or smaller silicon source and/or carrier gas flow rates may be used). HCl may also be flowed as described previously with reference to FIG. 6.

In at least one embodiment, the first silicon epitaxial film may have a thickness of about 2 angstroms to about 100 angstroms, although other thickness may be used. For example, a deposition time of about 1 second to about 100 seconds, and in one or more embodiments about 5 seconds, may be used.

After the first silicon epitaxial film is formed, in step 804, the substrate is exposed to at least a silicon source and a carbon source so as to form a carbon-containing silicon epitaxial film on the substrate over the first silicon epitaxial film. For example, the substrate may be exposed to a silicon source such as silane or disilane, a carbon source such as methane, and a carrier gas such as nitrogen. A dopant source such as phosphorous or boron, a germanium source or the like also may be used (as may any other suitable sources and/or gasses). During the epitaxial film formation process, a carbon containing epitaxial layer may be formed on any monocrystalline surface of the substrate while a polycrystalline layer may be formed on any polycrystalline layer and/or any amorphous layer present on the substrate (as previously described).

In at least one embodiment, a carbon source flow rate of approximately 1-5 sccm for methane may be used with a silicon source at a flow rate of about 50- 150 sccm for silane (or of about 10-40 sccm for disilane) and a nitrogen carrier gas at a flow rate of about 20-25 slm (although larger or smaller silicon source and/or carrier gas flow rates may be used). HCl may also be flowed if desired.

The carbon containing epitaxial film may have, for example, a thickness of about 2 angstroms to about 100 angstroms, although other thickness may be used. For example, a deposition time of about 1 second to about 50 seconds, and in one or more embodiments about 10 seconds, may be used.

After the carbon-containing silicon epitaxial film is formed, in step 805 the substrate is exposed to at least a silicon source (without a carbon source) so as to form a second silicon epitaxial film on the substrate over the carbon containing silicon epitaxial film. For example, the substrate may be exposed to a silicon source such as silane or disilane, and a carrier gas such as nitrogen. A dopant source such as phosphorous or boron, a germanium source or the like also may be used (as may any other suitable sources and/or gasses). The presence of the second silicon epitaxial film over the carbon-containing silicon epitaxial film may diminish the interaction of chlorine with carbon (and/or hydrogen) in the carbon-containing silicon epitaxial film (formed during step 804). HCl may also be flowed as described previously with reference to FIG. 6.

The second silicon epitaxial film may be formed, for example, by flowing a silicon source at a flow rate of about 50-150 sccm for silane (or a flow rate of about 10-40 sccm for disilane) and a nitrogen carrier gas at a flow rate of about 20 to 25 slm (although larger or smaller silicon source and/or carrier gas flow rates may be used). HCl may also be flowed as described previously with reference to FIG. 6.

In at least one embodiment, the second silicon epitaxial film may have a thickness of about 2 angstroms to about 100 angstroms, although other thickness may be used. For example, a deposition time of about 1 second to about 100 seconds, and in one or more embodiments about 5 seconds, may be used.

In step 806, the substrate is exposed to Cl2 so as to etch at least the second silicon epitaxial film, and/or any other films, formed during step 805 (e.g., polycrystalline silicon formed on polycrystalline and/or amorphous layers present on the substrate and/or monocrystalline silicon formed on the carbon-containing silicon epitaxial film). For example, in at least one embodiment, the substrate may be exposed to a Cl2 flow rate of about 30-50 sccm and nitrogen carrier gas flow rate of 20 slm (although larger or smaller Cl2 and/or nitrogen carrier gas flow rates may be used). HCl may also be flowed as described previously in reference to FIG. 5.

Following etching, the process chamber may be purged (e.g., with nitrogen and/or another inert gas for about 20 seconds or for some other suitable time period) to remove any Cl2 and/or any other unwanted species/by-products from the chamber. Thereafter, in step 807, a determination is made as to whether the epitaxial film formed on the substrate is of a desired thickness. For example, the thickness of the epitaxial film may be measured or estimated based on the process times and/or other parameters used during steps 803 and/or 804 and/or 805 and/or 806. If the film is of the desired thickness, the method 800 ends at step 808; otherwise, the method 800 returns to step 803 and additional deposition steps (step 803-805), and an additional etch step (step 806) are performed on the substrate. Steps 803, 804, 805 and/or 806 may be repeated until the desired film thickness is achieved.

The methods 700 and/or 800 (of FIGS. 7 and 8) also may be employed to encapsulate other types of silicon epitaxial films (in addition to carbon containing epitaxial films). For example, an additional element source such as a source of germanium, boron, phosphorous or the like may be used during step 703 (FIG. 7) or step 804 (FIG. 8) to form an additional element containing silicon epitaxial film. The additional element containing silicon epitaxial film then may be encapsulated during step 704 or step 805 in a manner similar to that described with reference to FIGS. 7 and 8 (e.g., to avoid exposing the additional element containing silicon epitaxial film to Cl2 during step 705 or step 806).

Figure 9:
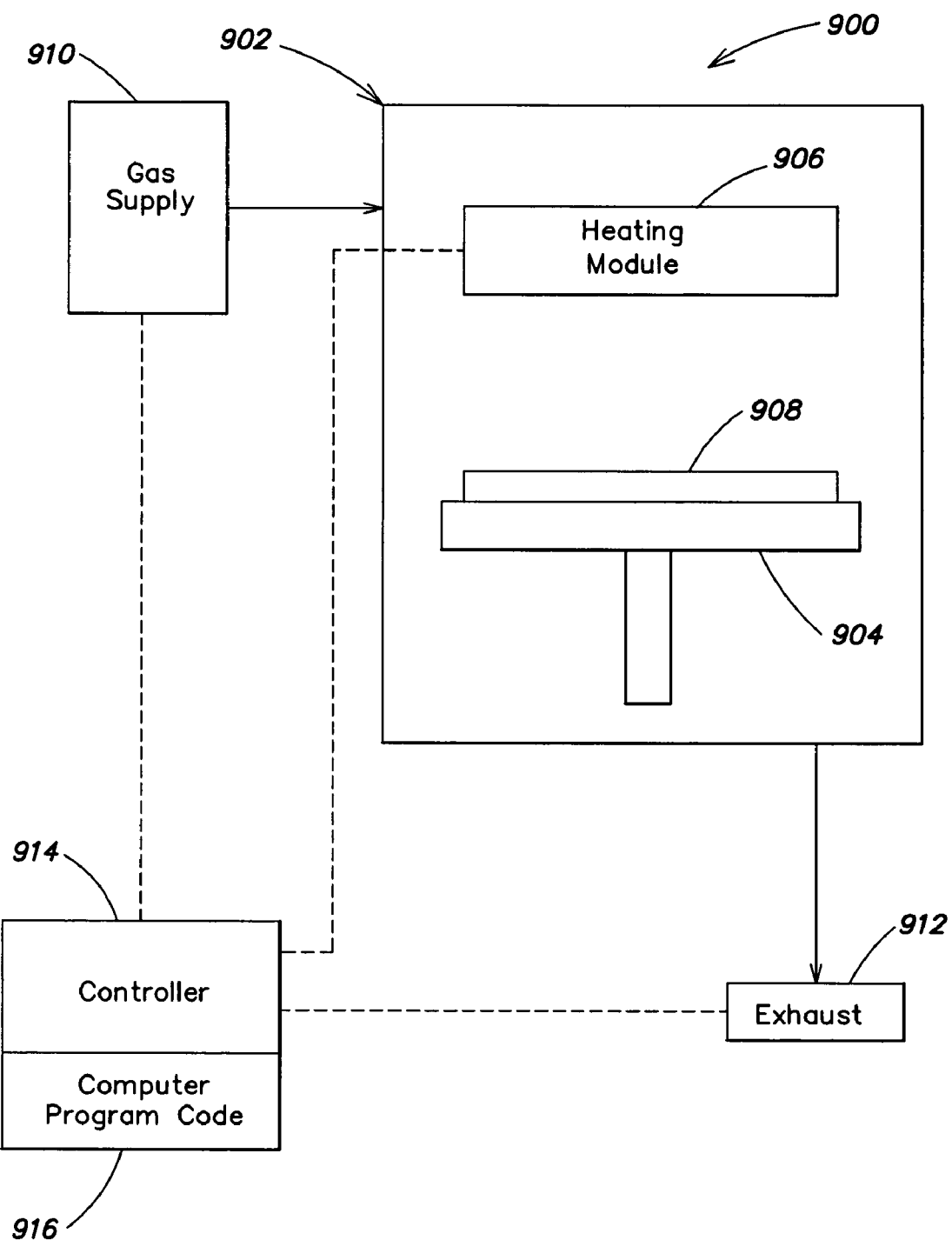
FIG. 9 is a block diagram of an exemplary epitaxial film formation system provided in accordance with the present invention.

FIG. 9 is a block diagram of an exemplary epitaxial film formation system 900 provided in accordance with the present invention. With reference to FIG. 9, the system 900 includes an epitaxial chamber 902 that includes a substrate support 904 and at least one heating module 906. The substrate support 904 is adapted to support a substrate 908 during epitaxial film formation within the epitaxial chamber 902; and the heating module 906 is adapted to heat the substrate 908 during epitaxial film formation within the epitaxial chamber 902. More than one heating module, and/or other heating module locations may be used. The heating module 906 may include, for example, a lamp array or any other suitable heating source and/or element.

The system 900 also includes a gas supply 910 and an exhaust system 912 coupled to the epitaxial chamber 902, and a controller 914 coupled to the epitaxial chamber 902, the gas supply 910 and/or the exhaust system 912. The gas supply 910 may include a source and/or delivery system for any source, carrier, etchant, dopant or other gasses employed by the epitaxial chamber 902. The exhaust system 912 may include any suitable system for exhausting waste gasses, reaction products, or the like from the chamber 902, and may include one or more vacuum pumps.

The controller 914 may include one or more microprocessors and/or microcontrollers, dedicated hardware, a combination the same, etc., that may be employed to control operation of the epitaxial chamber 902, the gas supply 910 and/or the exhaust system 912. In at least one embodiment, the controller 914 may be adapted to employ computer program code 916 for controlling operation of the system 900. For example, the controller 914 may perform or otherwise initiate one or more of the steps of any of the methods/processes described herein, including methods 500, 600, 700 and 800 of FIGS. 5-8. Any computer program code that performs and/or initiates such steps may be embodied as a computer program product. Each computer program product described herein may be carried by a medium readable by a computer (e.g., a carrier wave signal, a floppy disc, a compact disc, a DVD, a hard drive, a random access memory, etc.).

The use of both Cl2 and HCl in accordance with the present invention may be employed during a selective Si-containing deposition process, such as a co-flow process (e.g., a selective epitaxy process in which deposition and etch reactions occur simultaneously). Additionally, the use of both Cl2 and HCl in accordance with the present invention may be used to treat a surface of a Si-containing film or to form source/drain recess areas of metal oxide semiconductor field effect transistor (MOSFET) devices through silicon etch. Exemplary surface treatment processes and/or processes for forming source/drain recess areas of MOSFET devices that may benefit from a combined Cl2/HCl flow in accordance with the present invention are described in U.S. patent application Ser. No. 11/047,323, filed Jan. 31, 2005, which is hereby incorporated by reference herein in its entirety. During an AGS process, etch and deposition steps may be performed at different temperatures. For example, a deposition temperature may be lower than an etch temperature so as to increase substitutional carbon incorporation. In one particular embodiment, a substrate temperature of about 650° C. or less may be used during deposition and a substrate temperature of greater than about 650° C. may be used during etching. While the foregoing is directed to embodiments of the present invention, other and further embodiments of the invention may be devised without departing from the basic scope thereof, and the scope thereof is determined by the claims that follow.

The invention claimed is:

1. A method of forming an epitaxial film on a substrate comprising:
   (a) providing a substrate;
   (b) exposing the substrate to a silicon source and a carbon source so as to form a carbon containing silicon epitaxial film;
   (c) encapsulating the carbon containing silicon epitaxial film with an adjacent encapsulating film adapted to prevent the carbon containing silicon epitaxial film from being exposed to $Cl_2$; and
   (d) exposing the substrate to $Cl_2$ so as to etch the encapsulating film, wherein the encapsulating film prevents the carbon containing silicon epitaxial film from being exposed to the $Cl_2$.

2. The method of claim 1, further comprising repeating steps (b) through (d) at least once.

3. The method of claim 1, further comprising employing a substrate temperature of about 550 to 650 degrees Celsius during at least step (b).

4. The method of claim 3, further comprising employing a substrate temperature of less than about 600 degrees Celsius during at least step (b).

5. The method of claim 1, wherein step (c) includes exposing the substrate to the silicon source without the carbon source to form a silicon epitaxial film over the carbon containing silicon epitaxial film.

6. The method of claim 1 wherein step (b) includes:
   (i) exposing the substrate to the silicon source without a carbon source so as to form a first silicon epitaxial film;
   (ii) exposing the substrate to the silicon source with the carbon source so as to form a carbon containing silicon epitaxial film over the first silicon epitaxial film; and
   wherein step (c) includes:
   (iii) exposing the substrate to the silicon source without the carbon source so as to form a second silicon epitaxial film over the carbon containing silicon epitaxial film.

7. The method of claim 6, further comprising employing a processing time for steps (i) and (iii) that is about half the processing time of step (ii).

8. The method of claim 1, further comprising flowing HCl during step (b).

9. The method of claim 1, further comprising flowing HCl during steps (b) and (c).

10. A method of forming an epitaxial film on a substrate comprising:
    (a) providing a substrate;
    (b) exposing the substrate to a silicon source and an additional element source so as to form an additional element containing silicon epitaxial film;
    (c) encapsulating the additional element containing silicon epitaxial film with an undoped silicon epitaxial encapsulating film adapted to prevent the additional element containing silicon epitaxial film from being exposed to $Cl_2$; and
    (d) exposing the substrate to $Cl_2$ so as to etch the encapsulating film, wherein the encapsulating film prevents the additional element containing silicon epitaxial film from being exposed to the $Cl_2$.

11. The method of claim 10 wherein the additional element source comprises a carbon source.

12. The method of claim 10 wherein the additional element source comprises a germanium source.

13. The method of claim 10 wherein the additional element source comprises a boron or phosphorous source.

14. The method of claim 10, further comprising repeating steps (b) through (d) at least once.

15. The method of claim 10, further comprising employing a substrate temperature of about 550 to 650 degrees Celsius during at least step (b).

16. The method of claim 15, further comprising employing a substrate temperature of less than about 600 degrees Celsius during at least step (b).

17. The method of claim 10 wherein step (b) includes:
(i) exposing the substrate to the silicon source without an additional element source so as to form a first silicon epitaxial film;
(ii) exposing the substrate to the silicon source with the additional element source so as to form an additional element containing silicon epitaxial film over the first silicon epitaxial film; and
wherein step (c) includes:
(iii) exposing the substrate to the silicon source without the additional element source so as to form a second silicon epitaxial film over the additional element containing silicon epitaxial film.

18. The method of claim 17, further comprising employing a processing time for steps (i) and (iii) that is about half the processing time of step (ii).

19. The method of claim 10, further comprising flowing HCl during step (b).

20. The method of claim 10, further comprising flowing HCl during steps (b) and (c).

21. A method of forming an epitaxial film on a substrate comprising:
(a) providing a substrate;
(b) exposing the substrate to a silicon source and an additional element source so as to form an additional element containing silicon epitaxial film;
(c) encapsulating the additional element containing silicon epitaxial film with an epitaxial encapsulating film adapted to prevent the additional element containing silicon epitaxial film from being exposed to $Cl_2$; and
(d) exposing the substrate to $Cl_2$ so as to etch the encapsulating film, wherein the encapsulating film prevents the additional element containing silicon epitaxial film from being exposed to the $Cl_2$.

* * * * *